US012690437B2

(12) United States Patent (10) Patent No.: US 12,690,437 B2
Song et al. (45) Date of Patent: Jul. 21, 2026

(54) SEMICONDUCTOR FABRICATION METHOD WITH IMPROVED DEPOSITION QUALITY AND SEMICONDUCTOR STRUCTURE THEREOF

(71) Applicant: Yangtze Memory Technologies Co., Ltd., Wuhan (CN)

(72) Inventors: Rui Song, Wuhan (CN); Jie Pan, Wuhan (CN); Peng Ding, Wuhan (CN); Jiewen Zhang, Wuhan (CN); Xufang Chen, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 923 days.

(21) Appl. No.: 17/878,340

(22) Filed: Aug. 1, 2022

(65) Prior Publication Data

US 2024/0038668 A1 Feb. 1, 2024

(51) Int. Cl.
| | |
|---|---|
| *H10W 20/20* | (2026.01) |
| *H10B 41/27* | (2023.01) |
| *H10B 43/27* | (2023.01) |
| *H10W 80/00* | (2026.01) |
| *H10W 90/00* | (2026.01) |

(52) U.S. Cl.
CPC ............ *H10W 20/20* (2026.01); *H10B 41/27* (2023.02); *H10B 43/27* (2023.02); *H10W 90/00* (2026.01); *H10W 80/312* (2026.01); *H10W 80/327* (2026.01); *H10W 90/792* (2026.01)

(58) Field of Classification Search
CPC . H01L 2224/08145; H01L 2224/80895; H01L 2224/80896; H01L 23/535; H01L 24/08; H01L 24/80; H01L 25/0657; H01L 25/18; H01L 25/50; H01L 2924/1431; H01L 2924/14511; H10B 41/27; H10B 43/27; H10B 43/50
See application file for complete search history.

(56) References Cited

U.S. PATENT DOCUMENTS

| | | | | |
|---|---|---|---|---|
| 9,299,649 | B2 * | 3/2016 | Chiu | .................... H01L 21/6835 |
| 9,461,018 | B1 * | 10/2016 | Tsai | ....................... H01L 21/565 |
| 12,033,966 | B2 * | 7/2024 | Chen | ....................... H01L 25/50 |
| 2018/0277497 | A1 * | 9/2018 | Matsuo | .................... H10D 88/00 |
| 2018/0314003 | A1 * | 11/2018 | Coolbaugh | ........... H01L 25/167 |
| 2022/0208705 | A1 * | 6/2022 | Chen | ....................... H01L 25/50 |
| 2025/0226290 | A1 * | 7/2025 | Haba | .................... H01L 23/467 |

FOREIGN PATENT DOCUMENTS

| | | | | |
|---|---|---|---|---|
| WO | WO-2019003060 A1 * | 1/2019 | ............. H10D 30/69 |
| WO | WO-2021142980 A1 * | 7/2021 | ............. H10B 43/35 |

* cited by examiner

*Primary Examiner* — Telly D Green
(74) *Attorney, Agent, or Firm* — Anova Law Group, PLLC

(57) ABSTRACT

A structure includes a base layer and conductive element in a dielectric region. The base layer includes a first material and is perpendicular to a direction. The conductive element includes a conductive material and contacts the base layer and the dielectric region. An interface parallel to the direction is formed between the conductive element and the dielectric region. A deposition rate of the conductive material over a surface of the base layer is higher than that over a surface of the dielectric region.

19 Claims, 16 Drawing Sheets

100

180

190

300

400

500

SEMICONDUCTOR FABRICATION METHOD WITH IMPROVED DEPOSITION QUALITY AND SEMICONDUCTOR STRUCTURE THEREOF

FIELD OF THE TECHNOLOGY

This application relates to the field of semiconductor technology and, specifically, to a semiconductor structure with improved metal deposition quality and a fabrication method thereof.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

The structure of a 3D NAND device includes conductive layers, vias, and metal lines. During the fabrication process, certain seams and voids often form in the conductive layers, vias, and metal lines. The seams and voids increase the electrical resistance and affect the performance of a device. Further, in some thinning processes, seams and voids are exposed. The exposed seams and voids trap erosive gaseous or liquid materials and become a reliability issue. The disclosed methods and structures are directed to solve problems set forth above and other problems.

SUMMARY

In one aspect of the present disclosure, a structure includes a dielectric region, a base layer in the dielectric region, and a conductive element in the dielectric region. The base layer includes a first material and is approximately perpendicular to a direction. The conductive element includes a conductive material and contacts the base layer and the dielectric region. An interface parallel to the direction is formed between the conductive element and the dielectric region. A deposition rate of the conductive material over a surface of the base layer is higher than that over a surface of the dielectric region.

In another aspect of the present disclosure, a method for fabricating a structure includes depositing a first material to form a base layer, depositing a dielectric material to forming a dielectric layer over the base layer, forming an opening through the dielectric layer to expose the base layer at a bottom of the opening, and depositing a conductive material to fill the opening. A deposition rate of the conductive material over a surface of the base layer is higher than that over a surface of the dielectric layer.

In another aspect of the present disclosure, a system includes a memory device and a memory controller for controlling the memory device. The memory device includes a structure. The structure includes a dielectric region, a base layer in the dielectric region, and a conductive element in the dielectric region. The base layer includes a first material and is approximately perpendicular to a direction. The conductive element includes a conductive material and contacts the base layer and the dielectric region. An interface parallel to the direction is formed between the conductive element and the dielectric region. A deposition rate of the conductive material over a surface of the base layer is higher than that over a surface of the dielectric region.

Other aspects of the present disclosure can be understood by those skilled in the art in light of the description, the claims, and the drawings of the present disclosure.

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

FIGS. 1A, 2A-4A, and 5-12 schematically show a fabrication process of an exemplary 3D array device 100 according to aspects of the present disclosure. The 3D array device 100 is a part of a memory device and may also be referred to as a 3D memory structure. Among the figures, top views are in an X-Y plane and cross-sectional views are in a Y-Z plane or along a line in the X-Y plane.

Figure 1A:
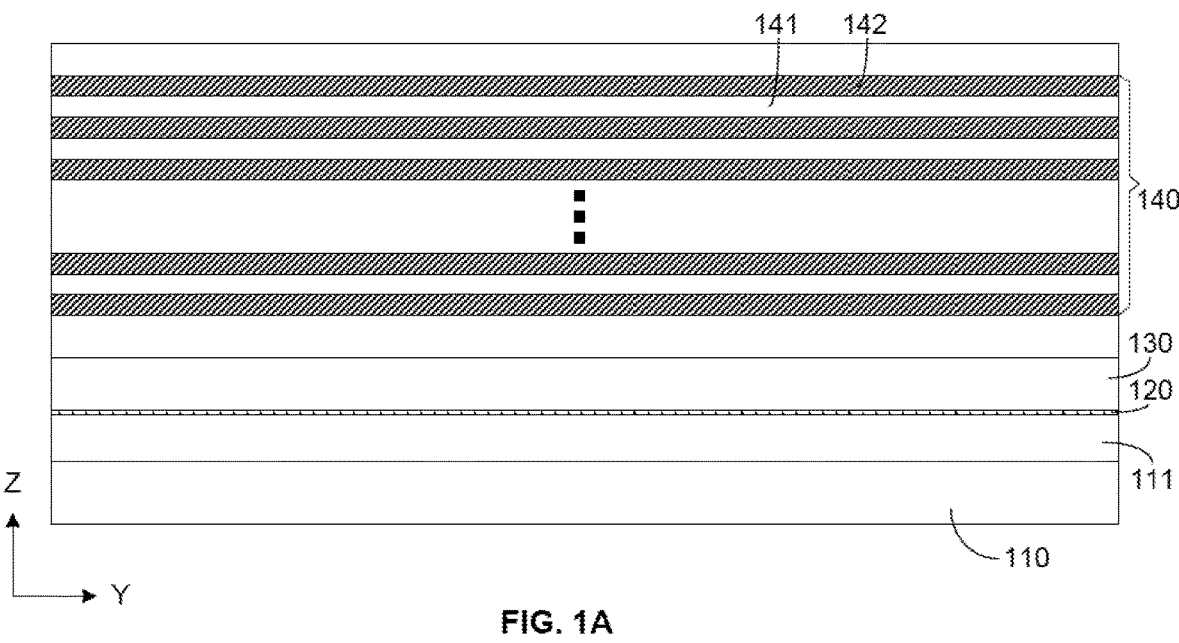
FIG. 1A illustrates a cross-sectional view of a structure of an exemplary three-dimensional (3D) array device at a certain stage during a fabrication process according to various aspects of the present disclosure.

As shown in a cross-sectional view in FIG. 1A, a structure of the 3D array device 100 includes a substrate 110. In some aspects, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some aspects, a top portion of the substrate 110 is doped by n-type dopants via ion implantation and/or diffusion to form a doped region 111. The dopants of the doped region 111 may include, for example, phosphorus (P), arsenic (As), and/or antimony (Sb). In some cases, a cover layer 120 is deposited over the doped region 111. The cover layer 120 is a sacrificial layer and may include a single layer or a multilayer. For example, the cover layer 120 may include one or more of silicon oxide layer and silicon nitride layer. The cover layer 120 may be deposited by chemical vapor deposition (CVD), physical vapor deposition (PVD), atomic layer deposition (ALD), or a combination thereof. In some other aspects, the cover layer 120 may include another material such as aluminum oxide.

Further, over the doped region 111, a sacrificial layer 130 is deposited. When the cover layer 120 is formed, the sacrificial layer 130 is deposited over it. The sacrificial layer 130 may include a dielectric material, a semiconductor material, or a conductive material. The word "conductive", as used herein, indicates electrically conductive of a material. An exemplary material for the sacrificial layer 130 is polysilicon.

After the polysilicon sacrificial layer 130 is formed, a dielectric stack 140 is formed. The dielectric stack 140 may be considered as a dielectric stack structure that includes multiple pairs of stack layers, for example, including first dielectric layers 141 and second dielectric layers 142, stacked alternately over each other. Some layers of the dielectric stack 140 are used to form memory cells. In some cases, the layers for fabricating memory cells may include 64 pairs, 128 pairs, or more than 128 pairs of the first and second dielectric layers 141 and 142.

In some aspects, the first dielectric layers 141 and the second dielectric layers 142 are made of different materials. In descriptions below, the first dielectric layer 141 includes a silicon oxide layer exemplarily, which may be used as an isolation stack layer, while the second dielectric layer 142 includes a silicon nitride layer exemplarily, which may be used as a sacrificial stack layer. The sacrificial stack layer will be subsequently etched out and replaced by a conductive stack layer. The first dielectric layers 141 and second dielectric layers 142 may be deposited via CVD, PVD, ALD, or a combination thereof.

Figure 1B:
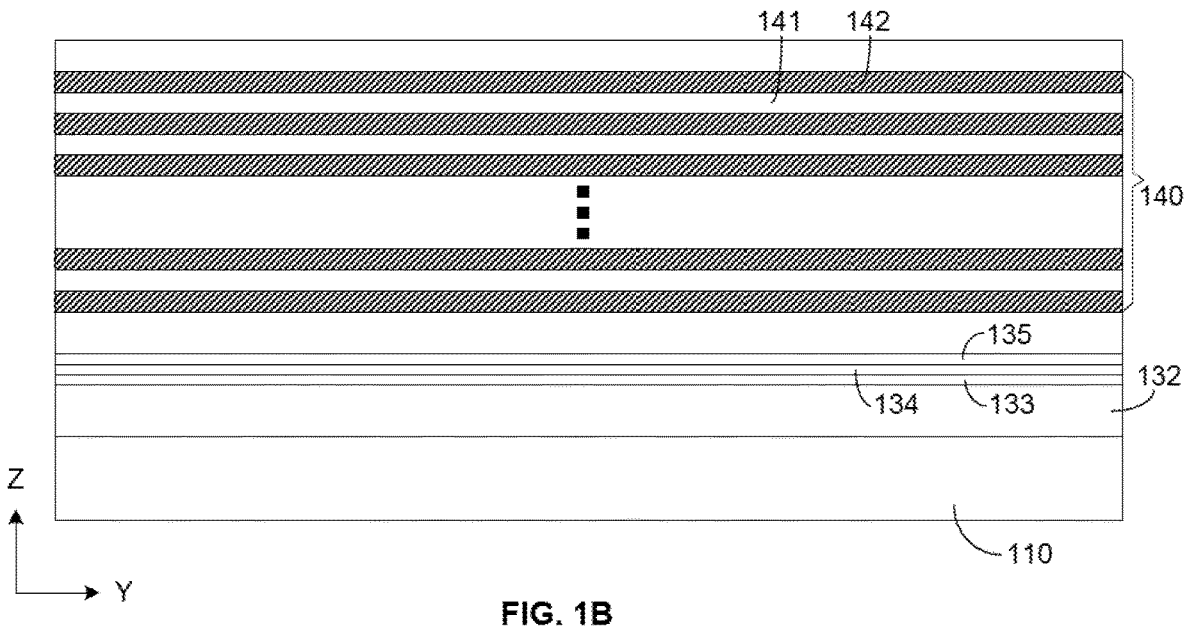
FIG. 1B illustrates a cross-sectional view of a structure of another exemplary 3D array device at a certain stage during another fabrication process according to various aspects of the present disclosure.

FIG. 1B shows a schematic cross-sectional view of a structure of another 3D array device 100A at a certain stage of another fabrication process according to aspects of the present disclosure. Provided the 3D array devices 100 and 100A have the same substrate 110 and the same dielectric stack 140. Optionally, a layer 132 (e.g., a polysilicon layer) may be deposited over the substrate 110, as shown in FIG. 1B. Further, layers 133, 134, and 135 may be grown sequentially over the layer 132. In some cases, the layers 133, 134, and 135 may be a silicon oxide layer, a silicon nitride layer, and a polysilicon layer, respectively. Optionally, the layers 132-134 may be sacrificial layers and etched away at a certain stage. The dielectric stack 140 is constructed over the layers 132-135. The layers may be deposited by CVD, PVD, ALD, or a combination thereof.

Figure 2A:
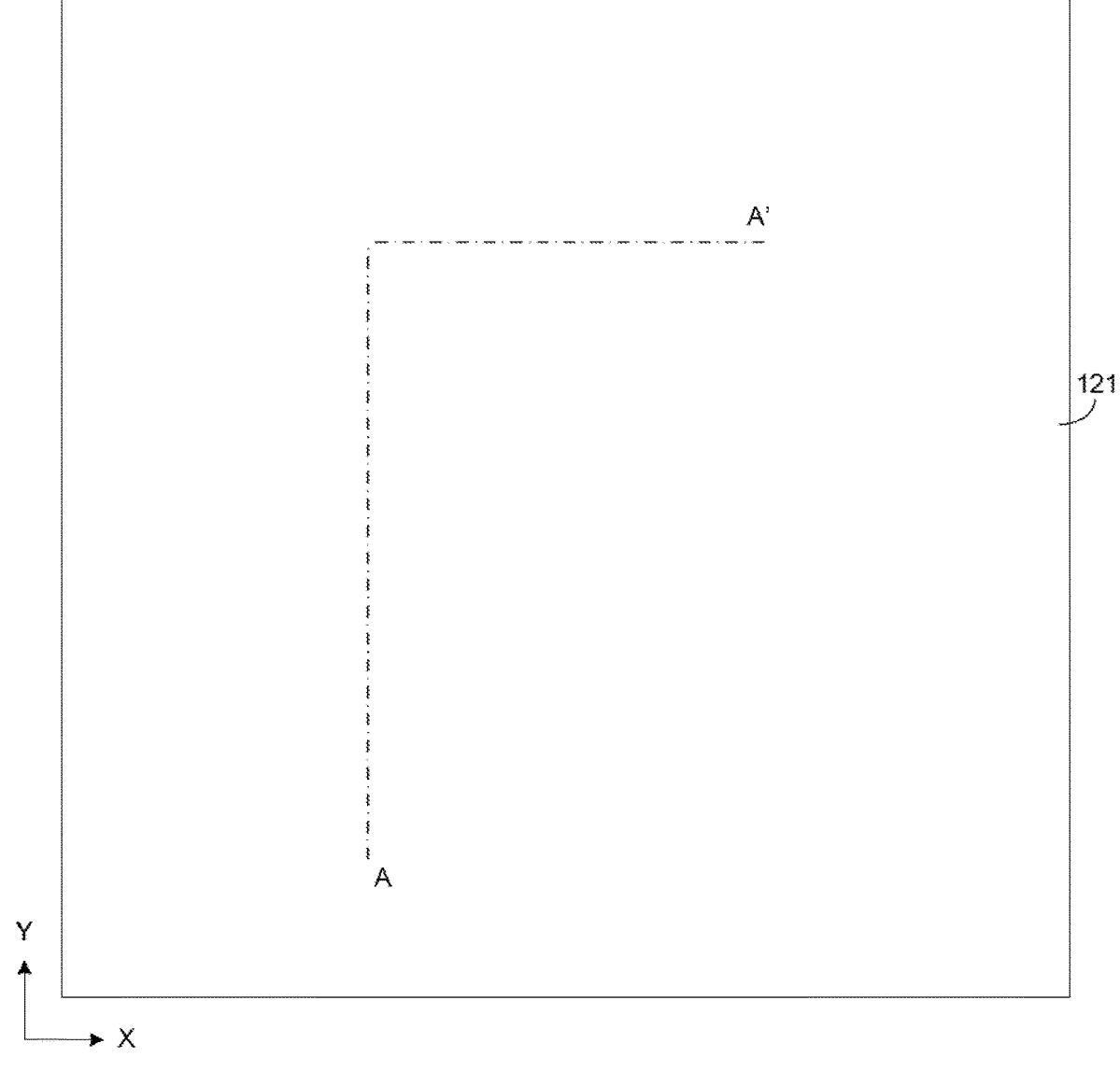
FIGS. 2A and 2B illustrate a top view and a cross-sectional view of the 3D array device shown in FIG. 1A at a certain stage during the fabrication process according to various aspects of the present disclosure.
Figure 2B:
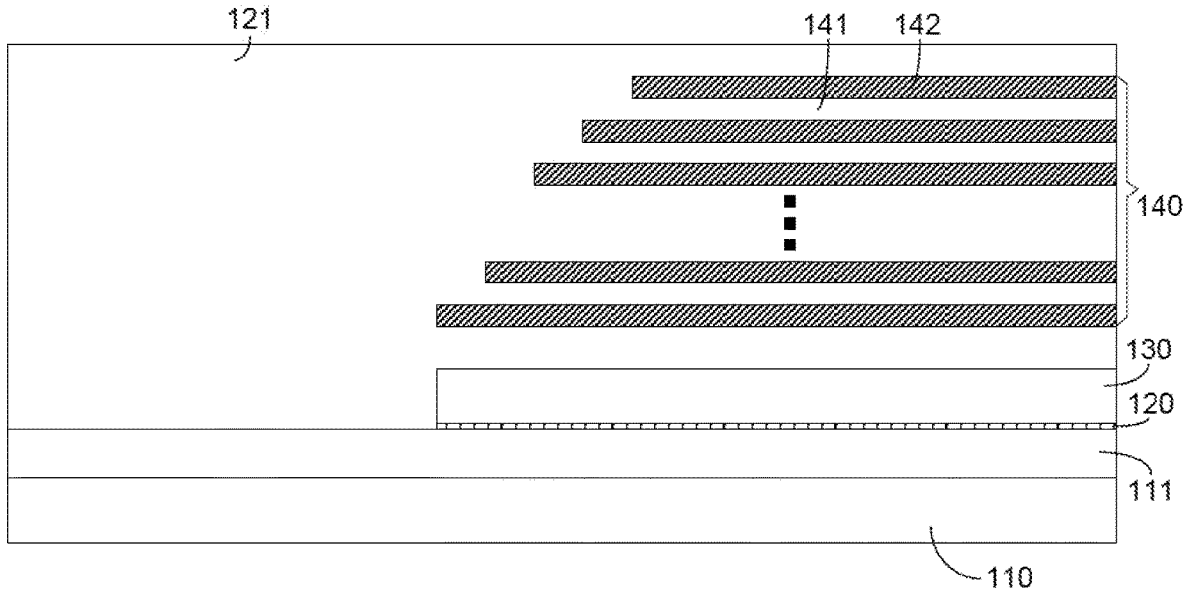

FIGS. 2A and 2B show a schematic top view and a schematic cross-sectional view of the structure of the 3D array device 100 as shown in FIG. 1A after an optional staircase formation process is performed according to aspects of the present disclosure. The cross-sectional view shown in FIG. 2B is taken along a line AA' of FIG. 2A. As shown in FIG. 2B, after the dielectric stack 140 is formed, the staircase formation process is performed to trim a part of the dielectric stack 140 into a staircase structure. Any suitable etching processes, including dry etch and/or wet etch process, may be used in the staircase formation process. For example, the height of the staircase structure may increase in a stepwise manner along the Y direction. A dielectric layer 121 is deposited to cover the staircase structure, the doped region 111, and the substrate 110. As shown in FIG. 2B, the dielectric stack 140, the sacrificial layer 130, and the cover layer 120 are removed in a region on a side of the staircase structure, e.g., on the left side of the staircase structure. The region may be viewed as a contact region where through silicon contacts connected to contact pads may be configured or an opening for contact pads may be arranged. The word "connected" as used herein, indicates electrically connected. The contact region contains a portion of the dielectric layer 121 and thus is a dielectric region. In some aspects, the cover layer 120 is not etched away in the staircase formation process and a portion of the cover layer 120 may be buried under the dielectric layer 121 in the contact region.

Figure 3:
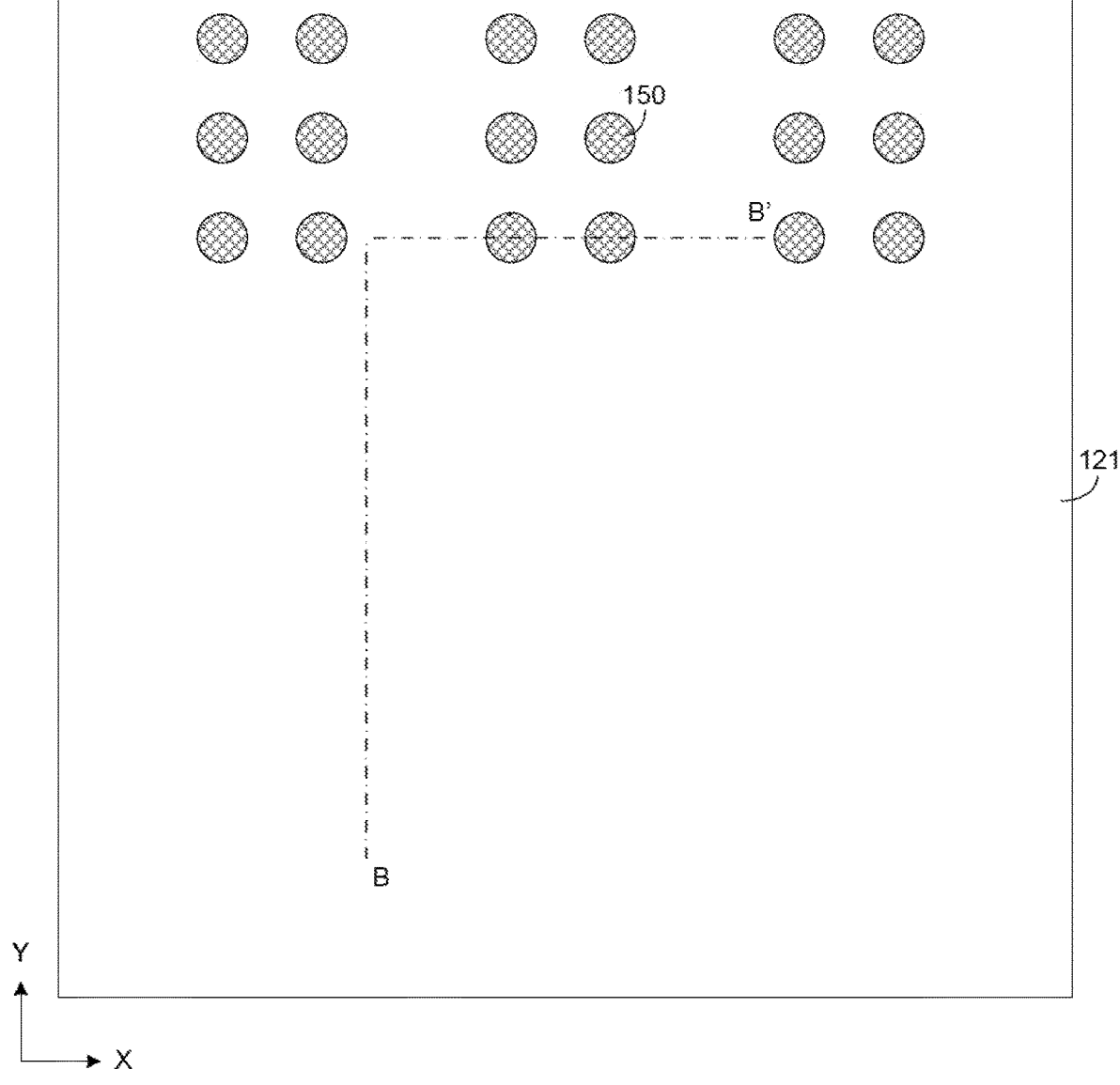
FIGS. 3 and 4A illustrate a top view and a cross-sectional view of the 3D array device shown in FIGS. 2A and 2B after channel hole structures are formed according to various aspects of the present disclosure.
Figure 4A:
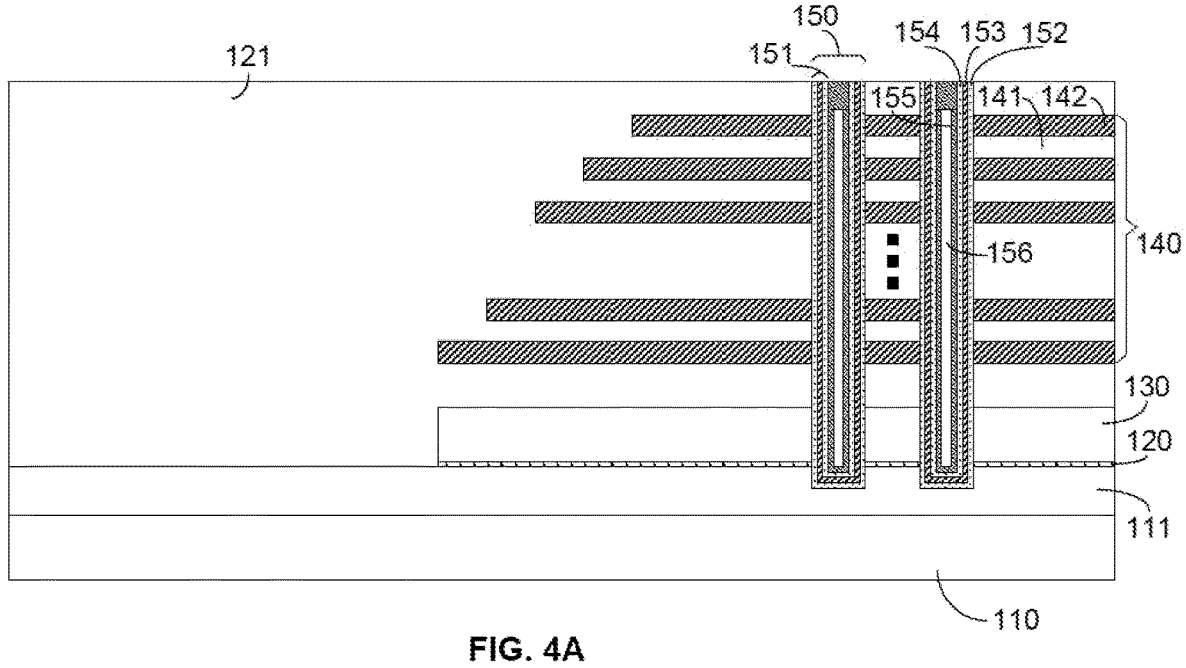

FIGS. 3 and 4A show a schematic top view and a schematic cross-sectional view of the structure of the 3D array device 100 as shown in FIGS. 2A-2B after channel hole structures 150 are formed according to aspects of the present disclosure. The cross-sectional view shown in FIG. 4A is taken along a line BB' of FIG. 3. The quantity, dimension, and arrangement of the channel hole structures 150 shown in FIGS. 3 and 4A and in other figures in the present disclosure are exemplary and for description purposes, although any suitable quantity, dimension, and arrangement may be used for the disclosed 3D array device 100 according to various aspects of the present disclosure.

As shown in FIGS. 3 and 4A, the channel hole structures 150 are arranged to extend in the Z direction or in a direction approximately perpendicular to the substrate 110 and form an array of a predetermined pattern (not shown) in the X-Y plane. The channel holes may be formed by, for example, a dry etch process or a combination of dry and wet etch processes. Other processes may also be performed, such as a patterning process involving lithography, cleaning, and/or chemical mechanical polishing (CMP). The channel holes may have a cylindrical shape or pillar shape that extends through the dielectric stack 140, the sacrificial layer 130, the cover layer 120, and partially penetrates the doped region 111. After the channel holes are formed, a functional layer 151 is deposited on the sidewall and bottom of the channel hole. The functional layer 151 includes a blocking layer 152 on the sidewall and bottom of the channel hole to block an outflow of charges, a charge trap layer 153 on a surface of the blocking layer 152 to store charges during an operation of the 3D array device 100, and a tunneling layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, a high-k dielectric material such as aluminum oxide or hafnium oxide, or another wide bandgap material. The tunneling layer 154 may include one or more layers that may include one or more materials. The material for the tunneling layer 154 may include silicon oxide, silicon nitride, silicon oxynitride, a high-k dielectric material such as aluminum oxide or hafnium oxide, or another wide bandgap material.

Further, a semiconductor channel 155 is deposited on a surface of the tunneling layer 154. The semiconductor channel 155 includes a polysilicon layer in some aspects. Optionally, the semiconductor channel 155 may include an amorphous silicon layer. Like the channel holes, the semiconductor channel 155 also extends through the dielectric stack 140 and into the doped region 111. The blocking layer 152, the charge trap layer 153, the tunneling layer 154, and the semiconductor channel 155 may be deposited by, e.g., CVD and/or ALD. The structure formed in a channel hole, including the functional layer 151 and semiconductor channel 155, is referred to as the channel hole structure.

After the semiconductor channel 155 is formed, the opening of the channel hole is filled by an oxide material 156, as shown in FIG. 4A. In some cases, the functional layer 151 includes an oxide-nitride-oxide (ONO) structure. That is, the blocking layer 152 is a silicon oxide layer, the charge trap layer 153 is a silicon nitride layer, and the tunneling layer 154 is another silicon oxide layer.

Optionally, the functional layer 151 may have a structure different from the ONO configuration. In the following descriptions, the ONO structure is used exemplarily for the blocking layer 152, the charge trap layer 153, and the tunneling layer 154.

Referring to FIG. 4A, the channel hole structures 150 are fabricated after the staircase structure is formed. Optionally, the channel hole structures 150 may also be formed before the staircase formation process. For example, after the dielectric stack 140 is fabricated as shown in FIG. 1A, the channel holes may be formed and then the functional layer 151 and semiconductor channel 155 may be deposited. After the channel holes are filled with the oxide material 156, the staircase formation process may be performed to form the staircase structure.

Figure 4B:
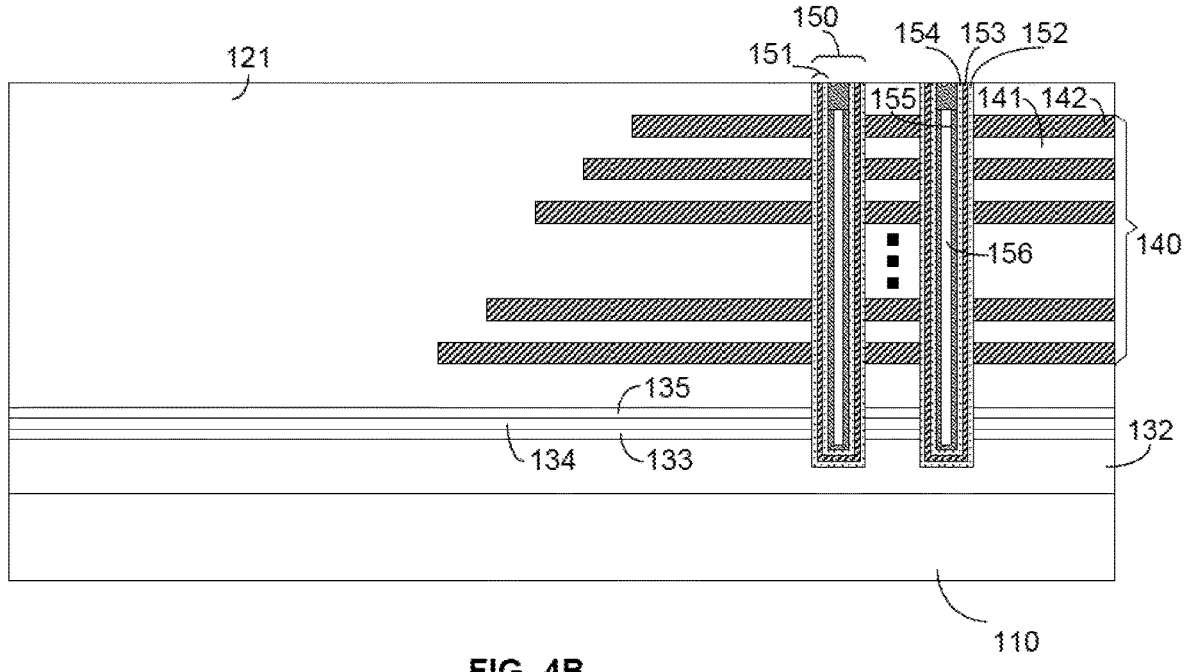
FIG. 4B illustrates a cross-sectional view of the 3D array device shown in FIG. 1B after channel hole structures are formed according to various aspects of the present disclosure.

FIG. 4B shows a schematic cross-sectional view of the structure of the 3D array device 100A as shown in FIG. 1B at a certain stage of the other fabrication process according to aspects of the present disclosure. The cross-sectional view reflects the structure after a staircase formation process is performed and channel hole structures 150 are fabricated. Provided the 3D array devices 100 and 100A have the same channel hole structures 150. The quantity, shape, and arrangement of the channel hole structures 150 shown in FIG. 4B are exemplary and for description purposes.

In some aspects, when a part of the dielectric stack 140 is trimmed to make a staircase structure, the layers 132-135 are not etched during the staircase formation process. The channel holes may have a cylindrical shape or pillar shape that extends through the dielectric stack 140, the layer 133-135, and partially penetrates the layer 132. After the channel holes are formed, CVD and/or ALD is performed for deposition processes. A functional layer 151 and a semiconductor channel 155 are deposited on the sidewall and bottom of the channel hole sequentially. The functional layer 151 includes a blocking layer 152, a charge trap layer 153, and a tunneling layer 154. As such, the blocking layer 152 contacts the layer 132. Exemplarily, the functional layer 151 has the ONO structure. The semiconductor channel 155 includes a polysilicon layer in some cases. The opening of the channel hole is filled by an oxide material 156 and a conductive plug connected to the semiconductor channel 155. The conductive plug may be formed by polysilicon in some aspects. The channel hole structures 150 may be fabricated before or after the staircase structure is made.

Figure 5:
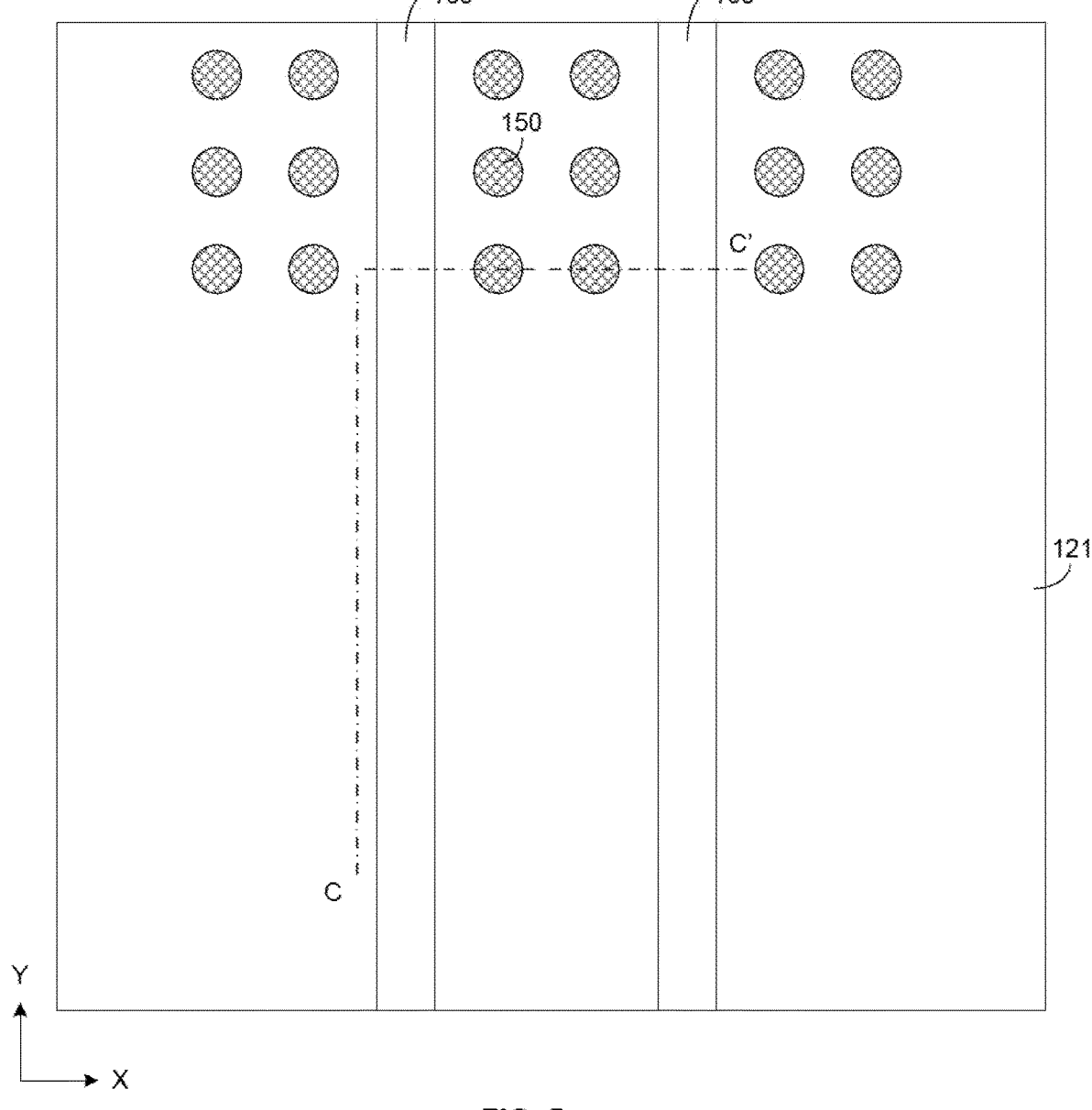
FIGS. 5 and 6 illustrate a top view and a cross-sectional view of the 3D array device shown in FIGS. 3 and 4A after gate line slits are formed according to various aspects of the present disclosure.
Figure 6:
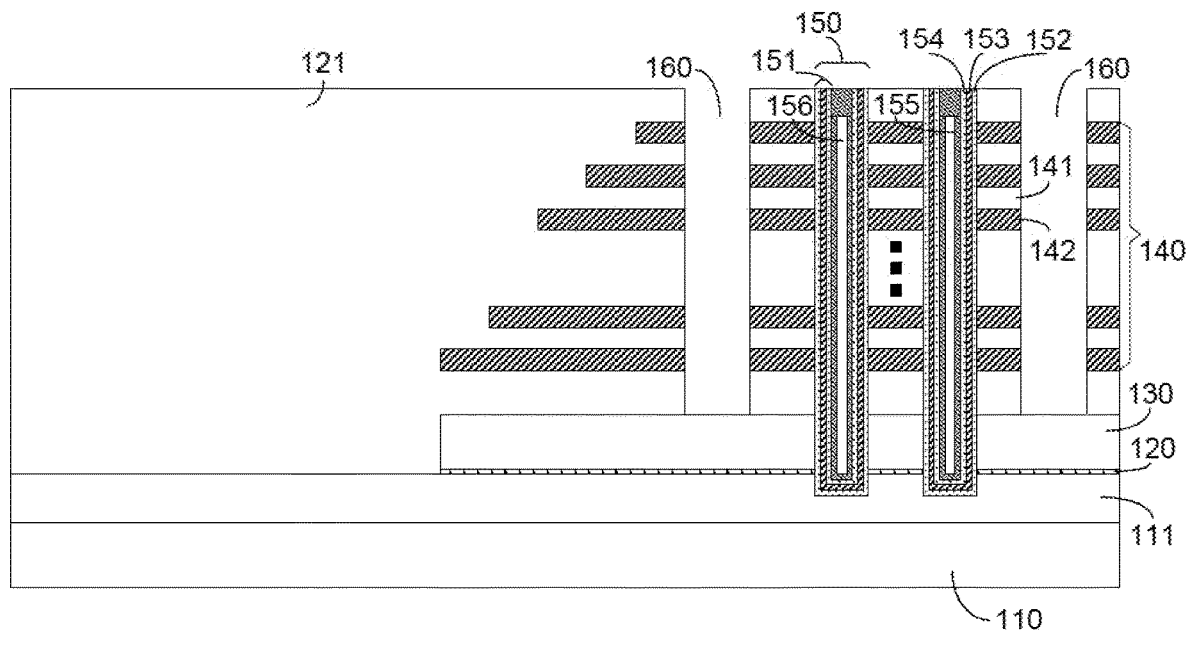

FIGS. 5 and 6 show a schematic top view and a schematic cross-sectional view of the structure of the 3D array device 100 shown in FIG. 4A after gate line slits 160 are formed according to aspects of the present disclosure. The cross-sectional view shown in FIG. 6 is taken along a line CC' of FIG. 5. A gate line slit may also be referred to as a gate line slit structure. The 3D array device 100 has a great number of channel hole structures 150 arranged in memory planes (not shown). Each memory plane is divided into memory blocks (not shown) and memory fingers by the gate line slits. For example, the pattern of the channel hole structures 150 in the X-Y plane as shown in FIG. 5 may reflect exemplarily memory fingers between the gate line slits 160. The quantity, dimension, and arrangement of the channel hole structures 150 and gate line slits 160 shown in FIG. 5 and in other figures in the present disclosure are exemplary and for description purposes.

The gate line slits 160 may be formed by, for example, a dry etch process or a combination of dry and wet etch processes. As shown in FIGS. 5 and 6, the gate line slits 160 extend, e.g., in the X and Y directions horizontally, and extend through the dielectric stack 140 and reach or partially penetrate the sacrificial layer 130 in the Z direction or in a direction approximately perpendicular to the substrate 110. As such, at the bottom of the gate line slit 160, the sacrificial layer 130 is exposed. Then, spacer layers (not shown) may be deposited on the sidewall and bottom of the gate line slit 160 by CVD and/or ALD. The spacer layers are configured to protect the first and second dielectric layers 141 and 142 and may include, for example, silicon oxide and silicon nitride.

After the spacer layers are deposited, selective etching is performed such that parts of the spacer layers at the bottom of the gate line slits 160 are removed by dry etch or a combination of dry etch and wet etch. The sacrificial layer 130 is exposed again. Subsequently, a selective etch process, e.g., a selective wet etch process, is performed to remove the sacrificial layer 130. Removal of the sacrificial layer 130 creates a cavity and exposes the cover layer 120 and bottom portions of the blocking layers 152 formed in the channel holes. Further, multiple selective etch processes, e.g., multiple selective wet etch processes, are performed to remove the exposed portions of the blocking layer 152, the charge trap layer 153, and the tunneling layer 154 consecutively, which exposes bottom side portions of the semiconductor channel 155.

When the cover layer 120 is silicon oxide and/or silicon nitride, the cover layer 120 may be removed when the bottom portions of the functional layers 151 are etched away. In certain aspects, the cover layer 120 includes a material other than silicon oxide or silicon nitride, and the cover layer 120 may be removed by one or more additional selective etch processes. Removal of the cover layer 120 exposes the top surface of the doped region 111.

After the etch processes, the doped region 111 and side portions of the semiconductor channel 155 close to the bottom of the channel hole structure 150 are exposed in the cavity left by etching away the sacrificial layer 130 and the cover layer 120. The cavity is filled by a semiconductor material, e.g., polysilicon, to form a semiconductor layer 131, e.g., by a CVD and/or ALD deposition process. The semiconductor layer 131 is n-doped, formed on the exposed surface of the doped region 111 and on sidewalls or side portions of the semiconductor channel 155, and connected to the doped region 111 and the semiconductor channel 155.

Optionally, a selective epitaxial growth is performed such that a layer of single crystalline silicon may be grown on the exposed surface of the doped region 111 and a polysilicon layer may be grown on the exposed surface of the semiconductor channel 155. Thus, the semiconductor layer 131 may include adjoined layers of single crystalline silicon and polysilicon.

Figure 7A:
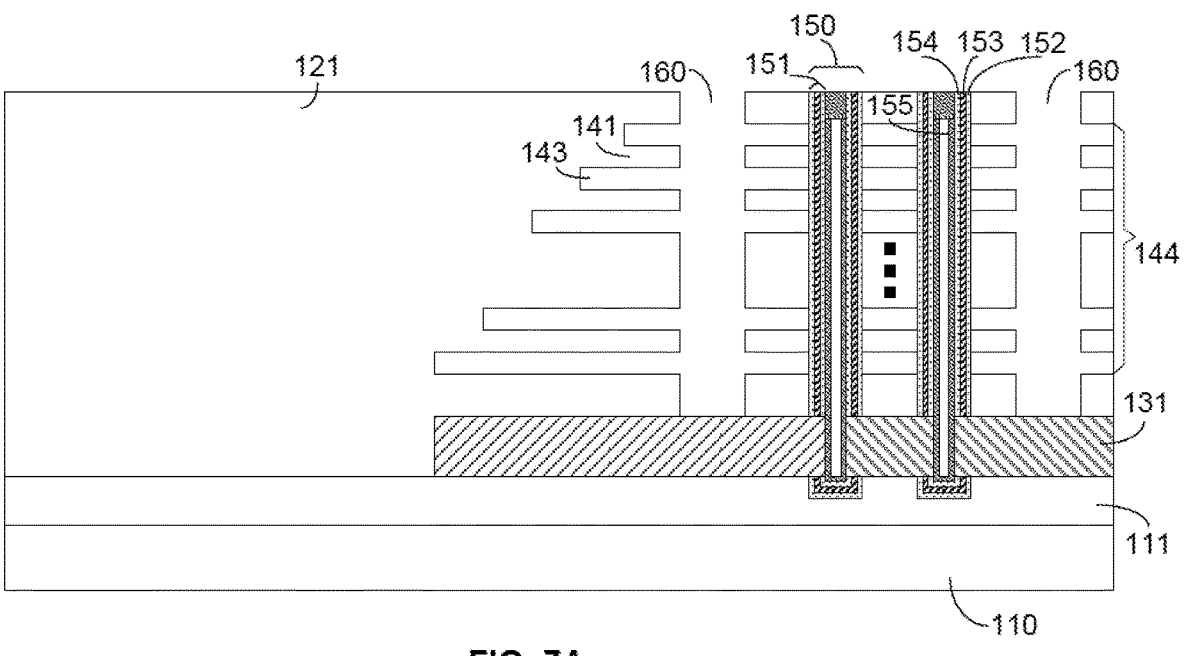
FIG. 7A illustrates a cross-sectional view of the 3D array device shown in FIGS. 5 and 6 at a certain stage in the fabrication process according to various aspects of the present disclosure.
Figure 7B:
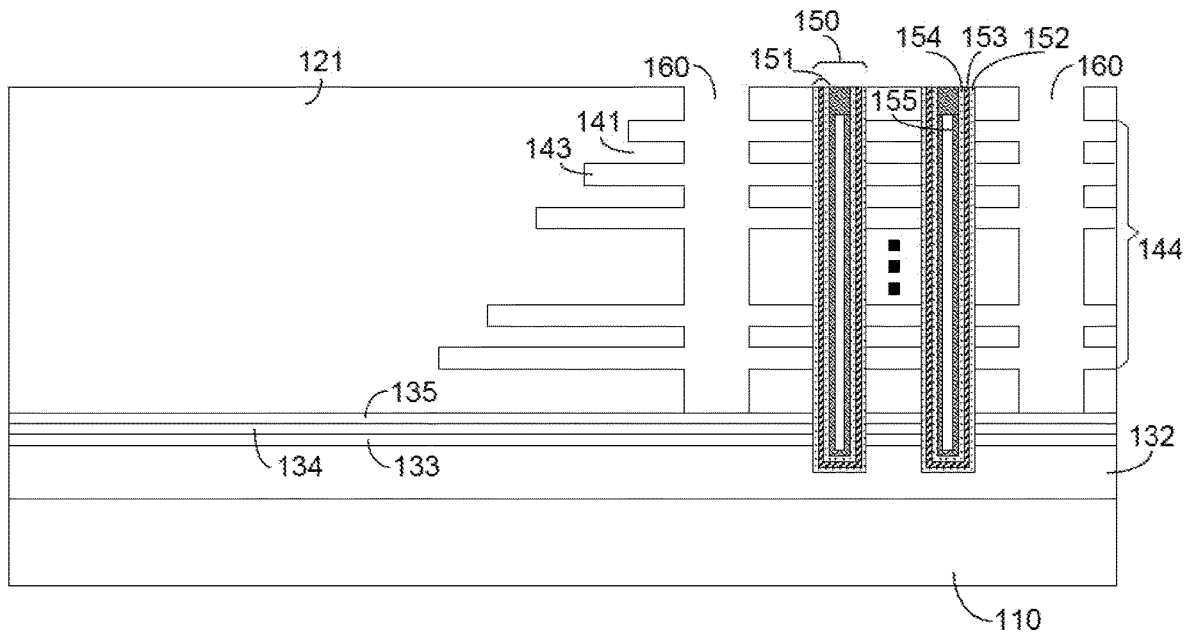
FIG. 7B illustrates a cross-sectional view of the 3D array device shown in FIG. 4B at a certain stage of the other fabrication process according to various aspects of the present disclosure.

When the bottom parts of the functional layer 151 and the cover layer 120 are etched, some spacer layers are etched away and the rest spacer layers remain on the sidewall of the gate line slits 160 to protect the first and second dielectric layers 141 and 142. After the semiconductor layer 131 is formed, the remaining spacer layers are removed in a selective etch process, e.g., a selective wet etch process, which exposes the sides of the second dielectric layer 142 around the gate line slits 160. In some aspects, the innermost spacer layer, which is in contact with the sidewall, is silicon nitride. Because the second dielectric layers 142 are also silicon nitride, the innermost spacer layer and the second dielectric layers 142 may be removed together during the etch process, leaving cavities 143 between the first dielectric layers 141, as shown in FIG. 7A. As such, the dielectric stack 140 is changed into a dielectric stack 144.

In certain other cases with respect to the structure of the 3D array device 100A shown in FIG. 4B, the gate line slits 160 may extend, e.g., through the dielectric stack 140 and reach the layer 135 in the Z direction. While the layer 135 is exposed at the bottom of the gate line slit 160, sides of the second dielectric layer 142 are exposed on the sidewall. Thereafter, the second dielectric layers 142 are removed in a selective etch, creating cavities 143 between the first dielectric layers 141 and changing the dielectric stack 140 into a dielectric stack 144, which is depicted exemplarily in FIG. 7B.

Figure 8:
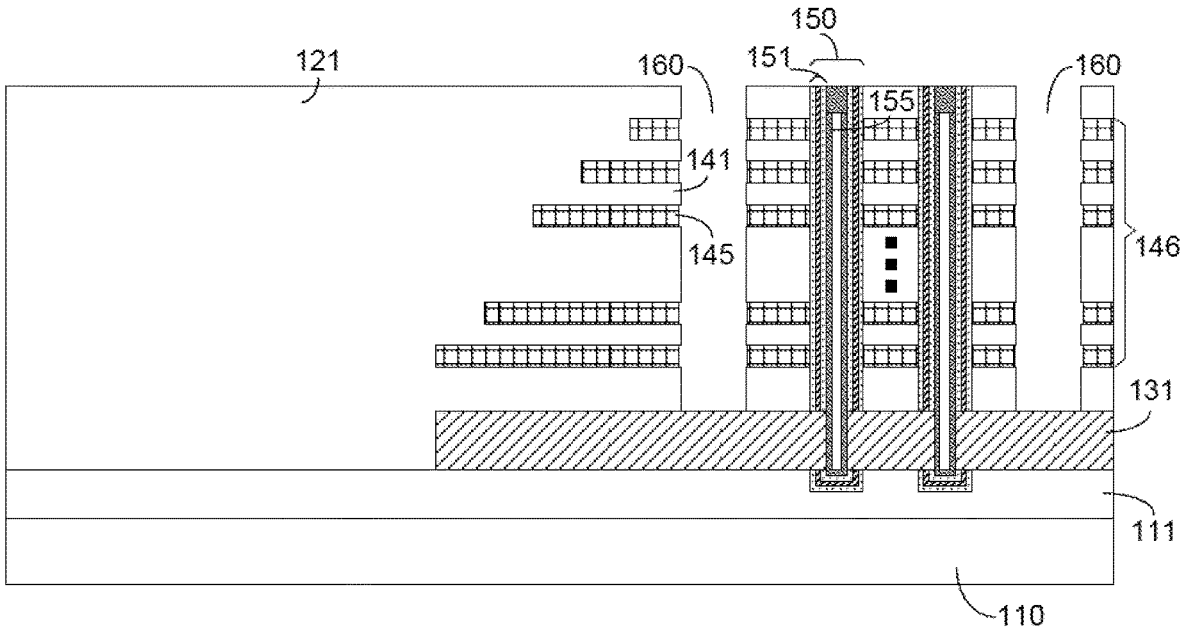
FIGS. 8, 9, and 10 illustrate cross-sectional views of the 3D array device shown in FIG. 7A at certain stages in the fabrication process according to various aspects of the present disclosure.

Referring back to FIG. 7A, after the cavities 143 are formed, a conductive material such as tungsten (W) is grown to fill the cavities 143 left by the removal of the second dielectric layers 142, forming conductive layers 145 between the first dielectric layers 141. After the conductive layers 145 are fabricated, the dielectric stack 144 is converted into a conductor/insulator stack 146, as shown in FIG. 8. The stack 146 may be considered as a conductor/insulator stack structure that contains the channel hole structures 150, or the functional layers 151 and semiconductor channels 155. The conductor/insulator stack 146 includes the first dielectric layers 141 and the conductive layers 145 that are alternatingly stacked over each other. In some aspects, before metal W is deposited in the cavities 143, a dielectric layer (not shown) of a high-k dielectric material such as aluminum oxide may be deposited. Thereafter, a layer of a conductive material such as titanium nitride (TiN) (not shown) is deposited. Further, metal W is deposited to form the conductive layers 145. CVD and/or ALD may be used in the deposition processes. Alternatively, another conductive material, such as molybdenum (Mo), ruthenium (Ru), cobalt (Co), copper (Cu), aluminum (Al), titanium (Ti), tantalum (Ta), tantalum nitride (TaN), doped silicon, or any combination thereof, may be used to form the conductive layers 145.

Referring to FIG. 8, a portion of each functional layer 151 in a channel hole structure 150 is between a portion of one of the conductive layers 145 and a portion of a semiconductor channel 155 in the channel hole structure 150. Each conductive layer 145 is configured to connect rows of NAND memory cells in an X-Y plane and is configured as a word line for the 3D array device 100. The semiconductor channel 155 formed in the channel hole structure 150 is configured to connect a column or a string of NAND memory cells along the Z direction and configured as a bit line for the 3D array device 100. As such, a portion of the functional layer 151 in the channel hole structure 150 in an X-Y plane, as a part of a NAND memory cell, is arranged between a conductive layer 145 and a semiconductor channel 155, i.e., between a word line and a bit line. The functional layer 151 may also be considered as disposed between the semiconductor channel 155 and the conductor/ insulator stack 146. A portion of the conductive layer 145 that is around a portion of the channel hole structure 150 functions as a control gate or gate electrode for a NAND memory cell. The 3D array device 100 can be considered as including a 2D array of strings of NAND cells (such a string is also referred to as a "NAND string") in the stack 146 or the conductor/insulator stack structure. Each NAND string contains multiple NAND memory cells and extends vertically toward the substrate 110. The NAND strings form a 3D array of the NAND memory cells through the conductor/insulator stack 146 over the substrate 110.

Figure 9:
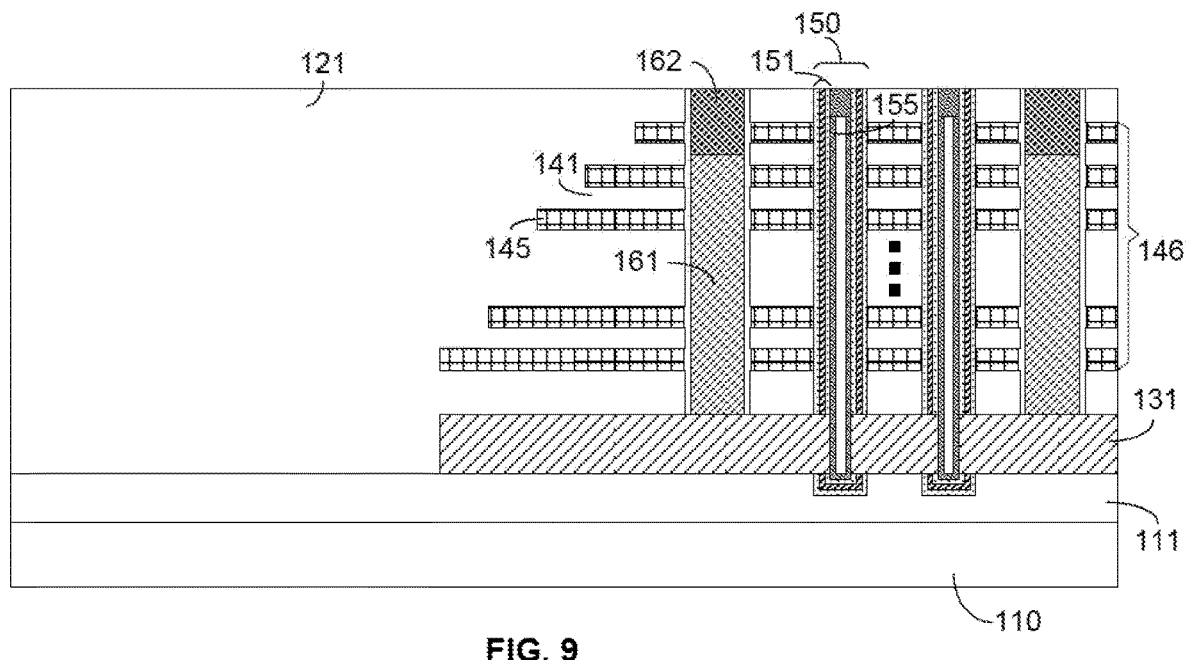

After the conductive layers 145 are grown in the cavities 143, a dielectric layer (e.g., a silicon oxide layer) may be deposited on the sidewalls and bottom surfaces of the gate line slits 160 by CVD and/or ALD. A dry etch process or a combination of dry etch and wet etch processes may be performed to remove the dielectric layer at the bottom of the gate line slits to expose parts of the semiconductor layer 131. The gate line slits are filled with a conductive material 161 (e.g., doped polysilicon) and a conductive plug 162 (e.g., metal W). The conductive material 161 in the gate line slit extends through the conductor/insulator stack 146 and contacts the semiconductor layer 131, as shown in FIG. 9. The word "contact" as a verb indicates electrically contacting an object as used herein. In some cases, the filled gate line slits are used as an array common source for the 3D array device 100.

In some other cases, the gate line slits are not converted into an array common source. With reference to the structure of the 3D array device 100A shown FIG. 7B, after conductive layers 145 are formed in the cavities 143, the conductive material grown on the sidewalls and bottoms of the gate line slits are etched away. Further, one or more dielectric materials may be deposited to fill the gate line slits 160.

Figure 10:
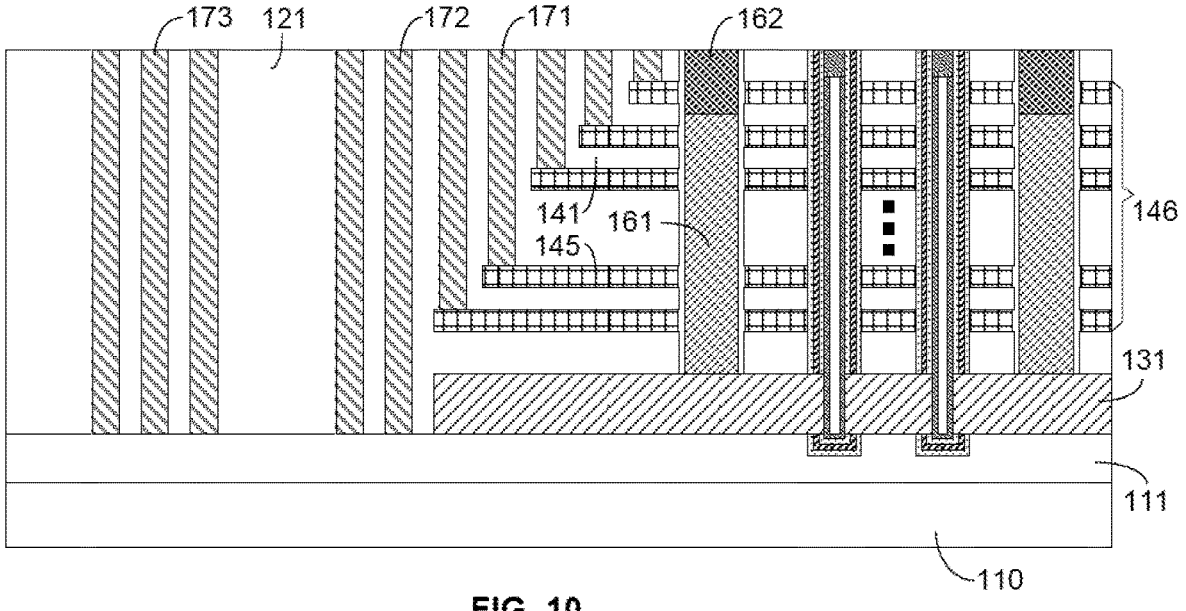

FIG. 10 shows a schematic cross-sectional view of the structure of the 3D array device 100 shown in FIG. 9 at a stage after certain contacts are formed according to aspects of the present disclosure. In some embodiments, after the gate line slits 160 are filled, openings (or cavities) for word line contacts 171 and through silicon contacts 172-173 are formed respectively in dielectric regions (e.g., the dielectric layer 121) by, e.g., a dry etch process or a combination of dry and wet etch processes. The openings extend along a direction approximately perpendicular to the substrate 110. The contacts 171-173 may also be considered as vias and are arranged as interconnects for the 3D array device 100. The openings for the contacts 171-173 are respectively filled with a conductive material by CVD and/or ALD. As shown in FIG. 10, the through silicon contacts 172 and 173 are formed in the contact region (i.e., a dielectric region) and beside the stack 146 and the NAND memory cells. The staircase structure is disposed between the contacts 172-173 and the stack 146, i.e., between the through silicon contacts 172-173 and the NAND memory cells. In some aspects, the contacts 172-173 extend to reach the doped region 111. Alternatively, the contacts 172-173 may extend to a level above the doped region 111 in the dielectric layer 121. The conductive material for the contacts 171-173 may include W, Mo, Ru, Co, Cu, Al, or a combination thereof. Optionally, a layer of a conductive material (e.g., TiN) may be deposited as a contact layer before another conductive material is deposited when the contacts 171-173 are fabricated respectively.

Figure 11:
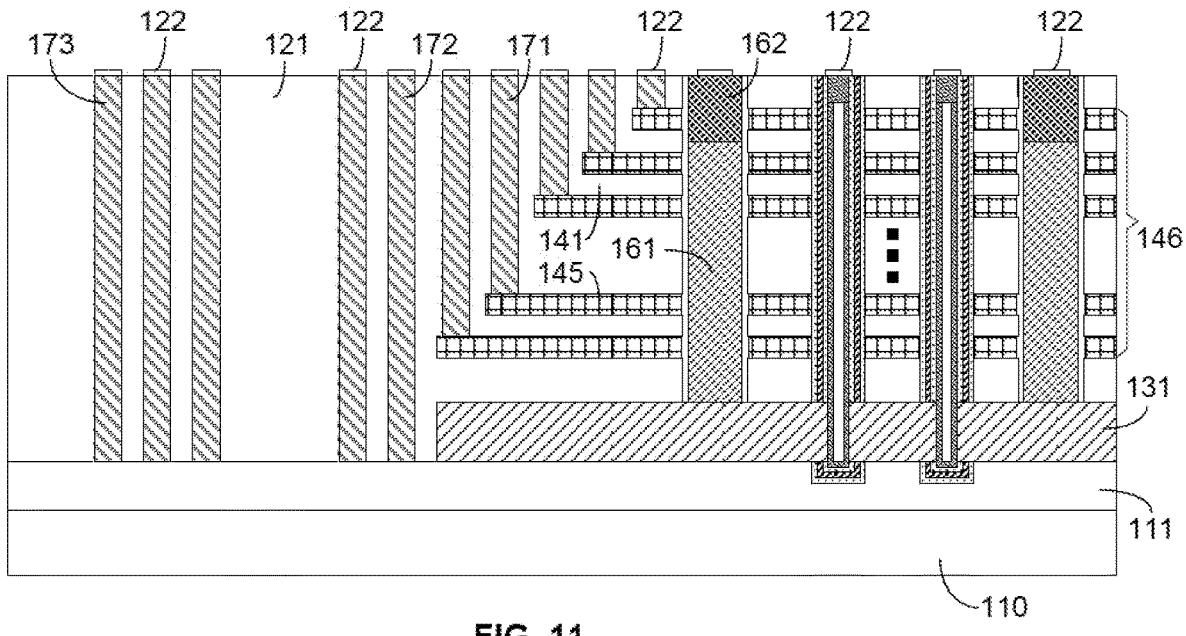
FIGS. 11 and 12 illustrate cross-sectional views of the 3D array device shown in FIG. 10 at certain stages in the fabrication process according to various aspects of the present disclosure.
Figure 12:
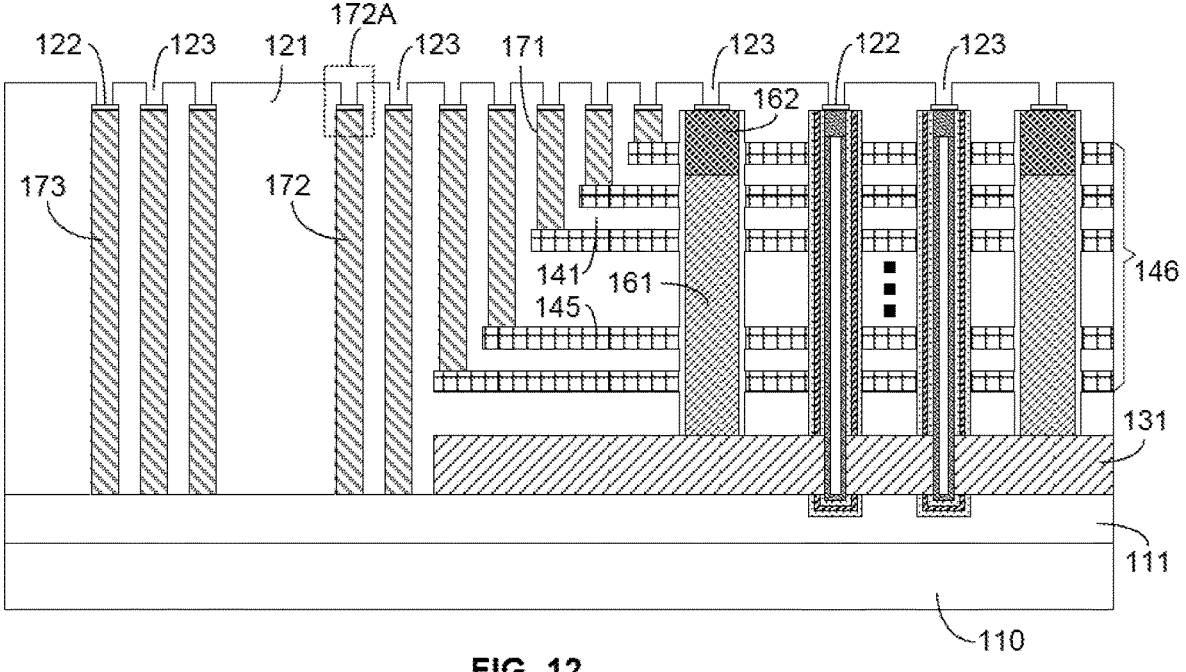

FIGS. 11 and 12 show schematic cross-sectional views of the structure of the 3D array device shown in FIG. 10 at certain stages in some embodiments. As depicted in FIG. 11, base layers 122 are deposited. The layers 122 are formed in an X-Y plane and perpendicular to the Z direction or vertical direction. The base layers 122 may contain TiN, Mo, or Ru and are made by CVD, ALD, or PVD after the contacts 171-173 are fabricated. The thickness of the layers 122 may be at least around 1-5 nanometers. The layers 122 are aligned with the contacts 171-173, the upper ends of NAND strings, and the plugs 162 of the array common source, respectively. Further, a CVD or PVD process is performed to deposit silicon oxide to cover the layers 122, and the dielectric layer 121 becomes thicker. Openings 123 for vias 174 are formed by a dry etch process or a combination of dry and wet etch processes. The opening 123 extends along a direction approximately perpendicular to the base layer 122 and substrate 110, and exposes the base layer 122 at the bottom of the opening 123, as shown in FIG. 12.

Figures 13A, 13B, 13C:
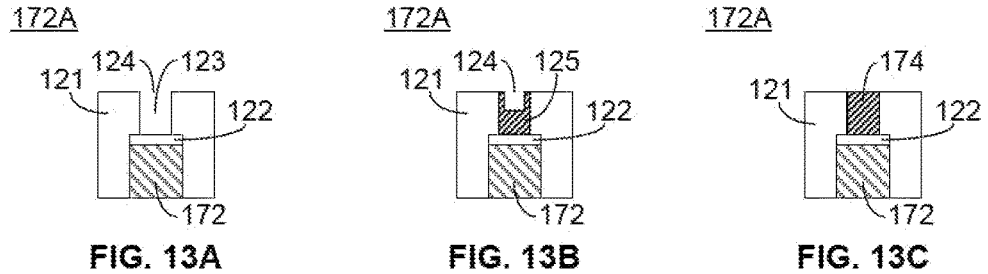
FIGS. 13A-13C illustrate filling an opening to form a via with respect to FIG. 12 according to various aspects of the present disclosure.

FIGS. 13A-13C schematically illustrate enlarged views of a portion 172A of the structure of the 3D array device. Referring to FIG. 12, the portion 172A represents a region corresponding to an opening 123 that is subsequently filled by a conductive material to become a via 174. FIG. 13A shows the opening 123 that extends through a portion of the dielectric layer 121 and exposes the base layer 122 at the bottom.

When the openings 123 are filled by a conductive material to form the vias 174 by CVD and/or ALD, the deposition rate is higher in areas around the entrance of the opening than areas in certain depth of the opening. The entrance may pinch off before the opening is fully filled by the conductive material, leaving a seam or void in the via behind the entrance region. The conductance of the via 174 may be decreased due to the seam or void.

Optionally, in order to reduce seams and voids in the vias 174, a Mo deposition process may be performed. For example, molybdenum pentachloride ($MoCl_5$) and hydrogen gas ($H_2$) may be supplied and CVD and/or ALD may be performed to deposit Mo to fill the opening 123. The deposition temperatures may be around 250-500 degrees Celsius. Further, the Mo deposition rate may be determined by the material of a surface. For example, the deposition rate on a TiN, Mo, or Ru surface may be higher or much higher (e.g., 10 times higher in some cases) than that on a surface of silicon oxide. The surface-selective or area-selective Mo growth may be used to fill an opening with fewer or no seams and voids.

As shown in FIG. 13A, the opening 123 is formed in the dielectric layer 121. Since the layer 121 is silicon oxide, the sidewall of the opening 123 is silicon oxide. Further, the bottom of the opening 123 is the base layer 122. Since the layer 122 is made of TiN, Mo, or Ru, the bottom of the opening 123 is a surface of TiN, Mo, or Ru. As illustrated above, when Mo is deposited by CVD and/or ALD, the deposition rate is higher or much higher in areas on a TiN, Mo, or Ru surface than that in areas on a silicon oxide surface. As such, a Mo layer 125 grows faster or much faster at the bottom than that on the sidewall of the opening 123, as shown in FIG. 13B. The higher deposition rate at the bottom of the opening 123 creates a bottom-up growth manner, which may be referred to as the Mo deposition process. When the Mo layer 125 grows in the Mo deposition process, it grows at a relatively slower speed in sidewall areas around the entrance 124, and thus the risk of pinch-off may be reduced. Hence, the opening 123 may be filled by Mo completely with fewer seams or voids, or without seams or voids in some cases in the Mo deposition process. The filled opening becomes a via 174 as depicted in FIG. 13C. Alternatively, the layer 122 may also be made from another conductive material, and the Mo deposition rate on a surface of this conductive material is higher than that on a surface of a dielectric material (e.g., silicon oxide).

The via 174 is formed in a space formed by the dielectric layer 121 in two orthogonal horizontal directions (e.g., the X and Y directions) and the base layer 122 in a vertical direction (e.g., the Z direction or a direction perpendicular to the base layer 122). The dielectric layer 121 surrounds the via 174 and the base layer 122 in the orthogonal horizontal directions and in planes parallel to the base layer 122 and substrate 110, and may cover the base layer 122 partially. The dielectric material surrounding the via 174 may be silicon nitride in some aspects. As there is no other material between the via 174 and base layer 122 and between the via 174 and dielectric layer 121, the via 174 contacts the base layer 122 and the dielectric layer 121 (or the silicon oxide sidewall of the opening 123) directly. As shown in FIG. 13C, an interface is formed between the via 174 and the dielectric layer 121. The interface is parallel to the Z direction or the vertical direction.

Figure 14:
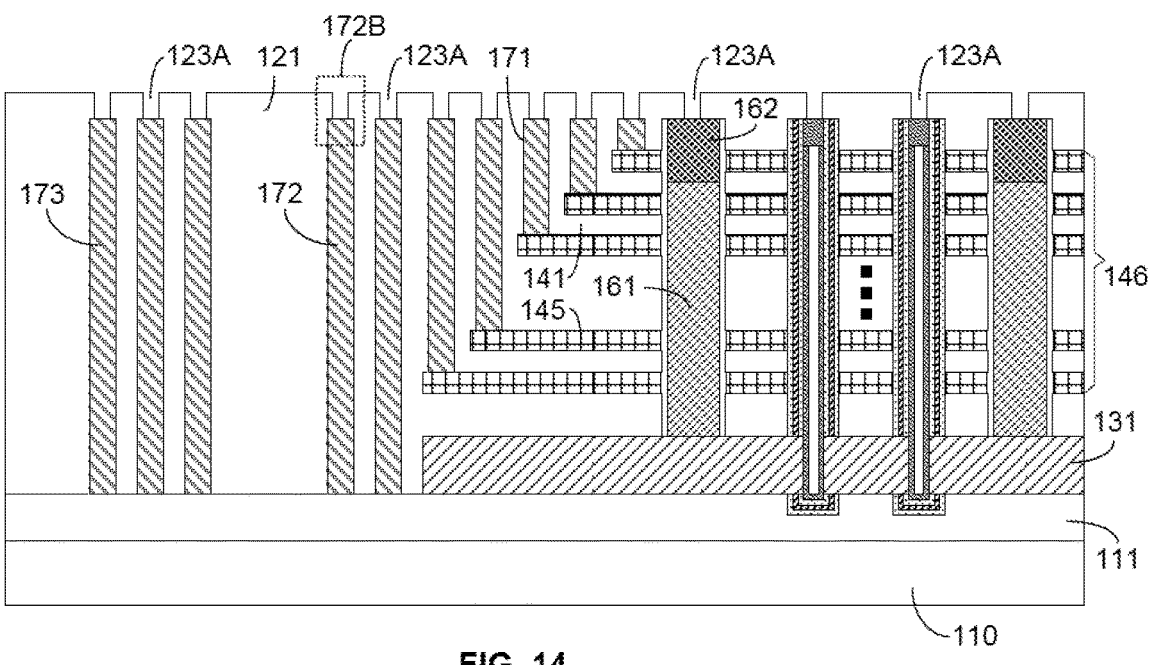
FIG. 14 illustrates a cross-sectional view of the 3D array device shown in FIG. 10 at a certain stage in the fabrication process according to various aspects of the present disclosure.

FIG. 14 shows a schematic cross-sectional view of the structure of the 3D array device shown in FIG. 10 at a certain stage in some other embodiments. As depicted in FIG. 14, a deposition process is performed to deposit silicon oxide to cover the contacts 171-173, and the dielectric layer 121 becomes thicker. Openings 123A for vias 174A are formed by a dry etch process or a combination of dry and wet etch processes. The opening 123A extends along a direction approximately perpendicular to the substrate 110, and exposes a contact (e.g., a contact 172) at the bottom of the opening 123A, as shown in FIG. 14.

Figures 15A, 15B, 15C, 15D:
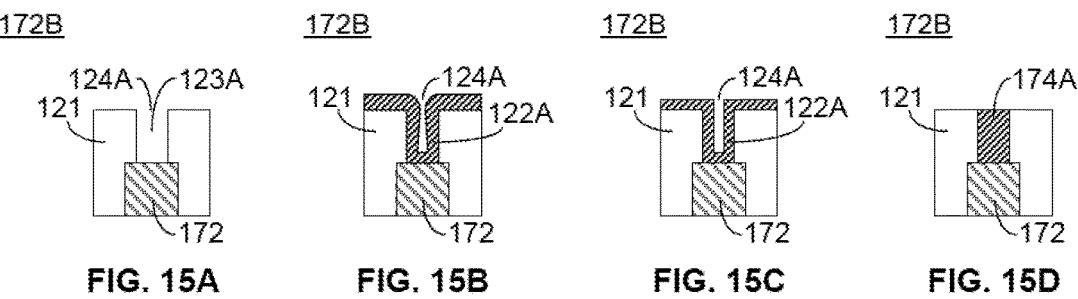
FIGS. 15A-15D illustrate filling an opening to form a via with respect to FIG. 14 according to various aspects of the present disclosure.

FIGS. 15A-15D schematically illustrate enlarged views of a portion 172B of the structure of the 3D array device. Referring to FIG. 14, the portion 172B represents a region corresponding to an opening 123A that is subsequently filled by a conductive material to become a via 174A. FIG. 15A shows the opening 123A with an entrance 124A. The opening 123A extends through a portion of the dielectric layer 121 and exposes the contact 172 at the bottom.

When the openings 123A are filled by a conductive material to form the vias 174A by CVD and/or ALD, the deposition rate is higher in areas around the entrance of the opening than areas in certain depth of the opening. The entrance may pinch off before the opening is fully filled by the conductive material, leaving a seam or void in the via behind the entrance region. The conductance of the via 174A may be affected due to the seam and void.

Optionally, in order to reduce seams and voids, a Mo filling process may be performed to fill the opening 123A. The Mo filling process includes multiple deposition steps and multiple etch steps, which form deposition-etch-deposition cycles. CVD and/or ALD is performed to deposit Mo inside the opening 123A at the deposition step. CVD and/or ALD is also used at the etch step to selectively remove Mo that has been deposited in the opening 123A. In some embodiments, molybdenum pentachloride ($MoCl_5$) and hydrogen gas ($H_2$) are supplied to deposit Mo at the deposition step. The deposition temperatures may be around 250-500 degrees Celsius.

Referring to FIG. 15B, when Mo is deposited by CVD and/or ALD, a Mo layer 122A is grown in the opening 123A. In some cases, a layer of TiN may be formed inside the openings before depositing Mo. The growth rate of the Mo layer 122A is not uniform in the opening 123A. As the density of $MoCl_5$ is higher at the entrance 124A than that at the bottom of the opening, the Mo layer 122A grows faster and is thicker in areas around the entrance 124A than areas at the bottom. Due to the growth rate difference, if the deposition process continues, the entrance 124A may pinch off. That is, the closure of the opening 123A may happen, leaving a hollow seam or void in the via 174A.

In order to avoid the pinch-off and formation of seams and voids in the vias 174A, the etch step may be implemented after the deposition step is performed for a certain time. For example, after a certain time of Mo deposition in the opening 123A by CVD and/or ALD at the deposition step, the supply of hydrogen gas may be stopped, while the supply of $MoCl_5$ continues. During the CVD or ALD process, both deposition and desorption happen. When $MoCl_5$ and hydrogen gas are supplied, the deposition rate is larger than the desorption rate and thus the Mo layer 122A grows. However, when $MoCl_5$ is supplied and hydrogen gas is shut off, the deposition rate become smaller than the desorption rate. Consequently, the Mo layer 122A is thinned. As such, lack of the hydrogen gas results in etching of the Mo layer that is deposited at the deposition step. As used herein, when $MoCl_5$ and hydrogen gas are supplied, the Mo layer grows and the deposition process is referred to as the deposition step. When $MoCl_5$ is supplied but hydrogen gas is not supplied, Mo is released from the Mo layer deposited at the deposition step and the desorption process is referred to as the etch step. In some cases, the desorption process is also viewed as a self-etch process.

As illustrated above, the supply of hydrogen gas may be stopped to start the etch step after the deposition step is performed for a certain time. Optionally, the supply of hydrogen gas may also be stopped to start the etch step after the thickness of the Mo layer in areas around the entrance 124A is thicker than a predetermined value. The thickness of the Mo layer 122A may be monitored directly or indirectly. In the latter case, the thickness may be estimated using data measured at a dummy opening that experiences a similar self-etch process.

Further, the etch rate of the Mo layer depends on the density of $MoCl_5$ and thus is not uniform inside the opening 123A. At the entrance 124A, the density of $MoCl_5$ is higher and the etch rate is relatively larger; while at the bottom, the density of $MoCl_5$ is lower and the etch rate is relatively smaller. Hence, more Mo is removed from areas around the entrance 124A than areas at the bottom. As such, the Mo layer 122A around the entrance 124A is etched more than that at the bottom. The etch step makes the Mo layer 122A more uniform, as shown in FIG. 15C, and the risk of pinch-off may be reduced.

In some cases, the etch step may be stopped and the deposition step may resume after the etch step is performed for a certain time. Optionally, the etch step may be stopped and the deposition step may resume after the thickness of the Mo layer in areas around the entrance 124A is below a predetermined value.

After the etch step ends and the deposition step resumes, Mo may be deposited inside the partially filled opening 123A for a certain time or until the thickness of the Mo layer in areas around the entrance 124A reaches a preset value. Further, the deposition step may be stopped and the etch step may begin to avoid the pinch-off, followed by another round of the deposition step. The deposition-etch-deposition cycle may be performed multiple times until the partially filled opening 123A is filled completely, as shown in FIG. 15D. The Mo filling process may contain one or more deposition-etch-deposition cycles. The filled opening 123A, i.e., the via 174A, may have reduced number of hollow seams and voids, and in some cases no seams and voids because of the Mo filling process.

Figure 16A:
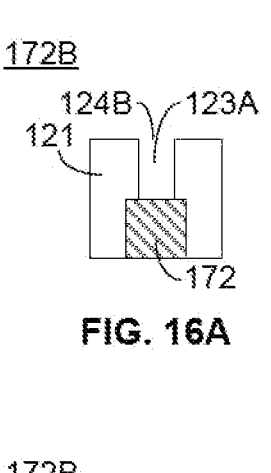
FIGS. 16A-16E illustrate filling an opening to form a via with respect to FIG. 14 according to various aspects of the present disclosure.
Figure 16B:
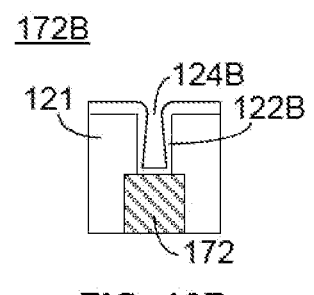
Figure 16C:
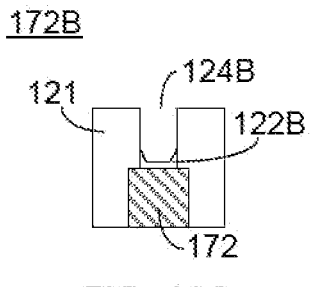

FIGS. 16A-16E schematically illustrate enlarged views of the portion 172B of the structure of the 3D array device. Again, the portion 172B represents the region corresponding to the opening 123A as shown in FIG. 14. FIG. 16A shows the opening 123A with an entrance 124B, exposing the contact 172. The deposition step and etch step as described with regard to FIGS. 15A-15D are used to fill the opening 123A. A Mo layer 122B is grown by CVD and/or ALD to partially fill the opening 123A in a deposition step. As shown in FIG. 16B, the layer 122B is thicker in areas around the entrance 124B than that in areas at the bottom of the opening. When the thickness of the layer 122B is larger than predetermined values in areas around the entrance, the deposition step stops and an etch step begins. The layer 122B is etched more in areas around the entrance 124B than areas at the bottom in the self-etch process. In some cases, the etch step may continue until the Mo layer is etched completely in areas around the entrance 124B. Optionally, the etch step may stop when the Mo layer is etched completely in certain sidewall areas in a given depth of the opening 123A. FIG. 16C illustrates such a case after the etch step stops, where the remaining Mo layer covers the bottom of the opening and forms a Mo layer 122B that is, for example, around 1-5 nanometer thick or thicker.

Figure 16D:
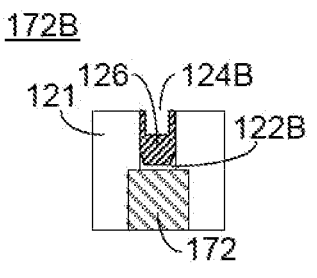

Further, another deposition step begins to deposit Mo in the opening 123A. As Mo is removed in the opening except the bottom areas and some sidewall areas close to the bottom, the sidewall is mostly silicon oxide. Then, the deposition process may have the bottom-up growth manner. The opening 123A is partially filled by another Mo layer 126, as shown in FIG. 16D. The deposition step may continue to fill the opening 123A completely with Mo.

Figure 16E:
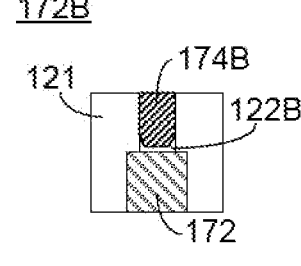

In some cases, the deposition step may stop and another etch step may begin to reduce the risk of pinch-off. For example, the deposition step may be stopped when the thickness of the layer 126 is larger than certain values in areas around the entrance 124B. The layer 126 is selectively etched in a subsequent etch step until, for example, the layer 126 is removed completely or thinner than certain values in areas around the entrance 124B. Further, another deposition step is started to fill the opening with Mo. The deposition-etch-deposition cycle continues until the opening 123A is filled fully with Mo to become a via 174B, as depicted in FIG. 16E. As depicted above, the bottom-up growth (i.e., the Mo deposition process) may be combined with the Mo filling process. For example, the Mo deposition process may be performed to partially fill an opening initially, followed by an etch step to avoid the closure of the opening. After the etch step, a deposition step may be performed to continue filling the opening. The etch step and deposition step may be performed multiple times until the opening is completely filled.

Figure 17A:
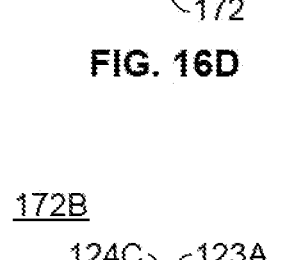
FIGS. 17A-17F illustrate filling an opening to form a via with respect to FIG. 14 according to various aspects of the present disclosure.
Figure 17A:
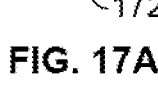
Figure 17B:
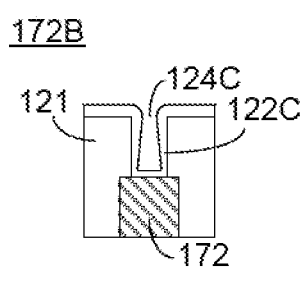

FIGS. 17A-17F schematically illustrate enlarged views of the portion 172B of the structure of the 3D array device. Again, the portion 172B represents the region corresponding to the opening 123A as shown in FIG. 14. FIG. 17A shows the opening 123A with an entrance 124C, exposing the contact 172. In some aspects, the opening 123A may be filled by Mo and another metal. Initially, a metallic material is deposited to grow a layer 122C in the opening 123A by CVD and/or ALD. As shown in FIG. 17B, the layer 122C fills the opening partially. The metallic material may include W, Co, Cu, Al, or a combination thereof, which are less expensive than Mo. Optionally, a layer of a conductive material (e.g., TiN) may be deposited as a contact/barrier layer before growing the layer 122C. The deposition process stops after the thickness of the layer 122C reaches a certain value. As shown in FIG. 17B, the entrance 124C is narrowed and the risk of pinch-off becomes higher. To avoid the closure of the opening 123A with a seam or void, the Mo filling process as illustrated above may be implemented.

Figure 17C:
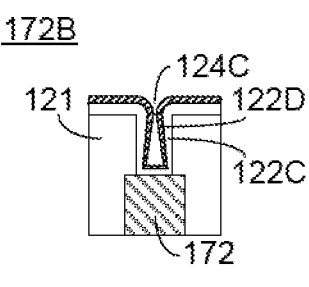
Figure 17D:
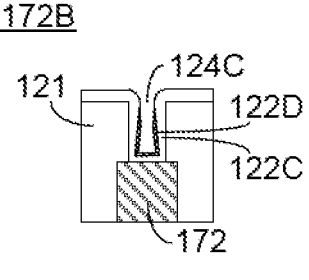
Figure 17E:
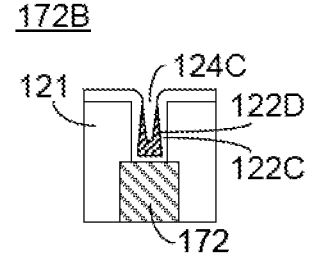
Figure 17F:
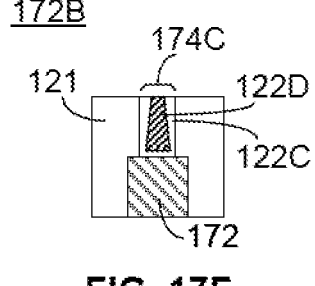

As shown schematically in FIG. 17C, a Mo layer 122D is grown by CVD and/or ALD to fill the opening 123A further in a deposition step. When the thickness of the layer 122D reaches a certain value in an area around the entrance 124C, the deposition step stops and an etch step begins. In the etch step, as aforementioned, a portion of the layer 122D is removed by the self-etch, the entrance 124C is enlarged, as shown in FIG. 17D. Thereafter, the deposition step resumes and the layer 122D grows again. The deposition-etch-deposition cycle continues to fill the opening 123A gradually until the opening is filled fully and the via 174C is formed, as shown in FIGS. 17E and 17F.

The via 174C contains two parts, the layer 122C as a metallic shell and the layer 122D as a Mo core. The layer 122C surrounds the layer 122D in an X-Y plane. When the opening 123A has a cylinder shape, the layer 122C may have a shape of a cup or barrel sitting on the contact 172. When the opening 123A is a trench, the layer 122C becomes a U-shaped tube. Because of the Mo filling process, the vias 174C may have fewer hollow seams and voids, and in some cases may have no seams and voids. As the layer 122C is made from less expensive materials, the cost of the vias 174C may be reduced.

The portions 172A and 172B as shown in FIGS. 13C, 15D, 16E, and 17F describe a structure that contains a conductive element (e.g., the vias 174 and 174A-174C) disposed in a dielectric region (e.g., the dielectric layer 121). The dielectric region may contain an oxide or nitride material. The conductive element may be made by the Mo deposition process or Mo filling process. When the structure has a base layer in the dielectric region, Mo may be deposited by the MO deposition process in the bottom-up manner. When the structure does not have a base layer, Mo may be deposited by the MO filling process through multiple deposition and etch steps. The Mo deposition process and Mo filling process may be employed to fabricate vias and conductive lines. In some embodiments, the Mo filling process may also be used to fill the cavities 143 of the dielectric stack 144 with respect to FIG. 7. As such, conductive layers 145 may contain Mo and have fewer seams and voids or no seams or voids. In descriptions below, the via 174 as shown in FIG. 13C is used for illustration purposes.

Referring back to FIGS. 12 and 13A-13C, after the vias 174 are made, conductor layers 175 for interconnect may be grown by CVD and/or ALD. The conductor layers 175 are deposited over and connected to the vias 174, respectively, and include a conductive material such as W, Mo, Ru, Co, Cu, Al, or a combination thereof. In some embodiments, the conductor layers 175 include conductive lines such as metal lines. In order to reduce seams and voids in the metal lines, the Mo deposition process or the Mo filling process as illustrated above may be implemented.

Figure 18:
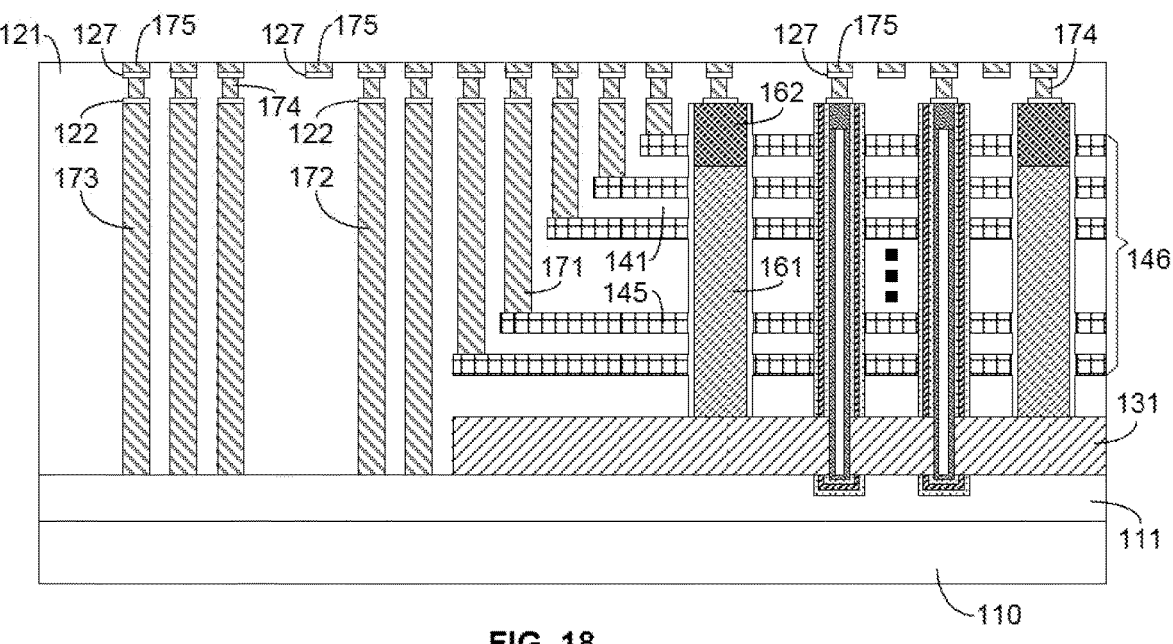
FIG. 18 illustrates a cross-sectional view of the 3D array device shown in FIG. 12 at a certain stage in the fabrication process according to various aspects of the present disclosure.

In some aspects, TiN, Mo, or Ru is deposited to form base layers 127 by CVD, ALD, or PVD. The base layers 127 may have the thickness of at least 1-5 nanometers. Certain portions of the layers 127 are aligned with and contact the vias 174, respectively. Further, a CVD or PVD process is performed to deposit silicon oxide on the layers 127, which thickens the dielectric layer 121. Trenches for the conductor layers 175 are formed by a dry etch process or a combination of dry and wet etch processes, exposing the layers 127. The trenches have a silicon oxide sidewall and a TiN, Mo, or Ru bottom. As illustrated above, Mo may be deposited in the trenches in the bottom-up manner. The trenches may be filled fully to become the conductor layers 175, as shown in FIG. 18. Alternatively, the layer 127 may also be made from another conductive material. Provided the Mo deposition rate on a surface of this conductive material is higher than that on a surface of a dielectric material (e.g., silicon oxide).

Further, vias 176 are formed over the conductor layers 175. For example, a dielectric material may be deposited to cover the conductor layers 175 and make the dielectric layer 121 thicker. Openings for vias 176 may be formed, and the openings may be subsequently filled with a conductive material to form the vias 176. The conductive material of the vias 176 may include W, Mo, Ru, Co, Cu, Al. Optionally, the Mo deposition process and/or the Mo filling process may be utilized to form the vias 176 that contain fewer hollow seams and voids or do not contain seams and voids for reasons illustrated above.

Figure 19:
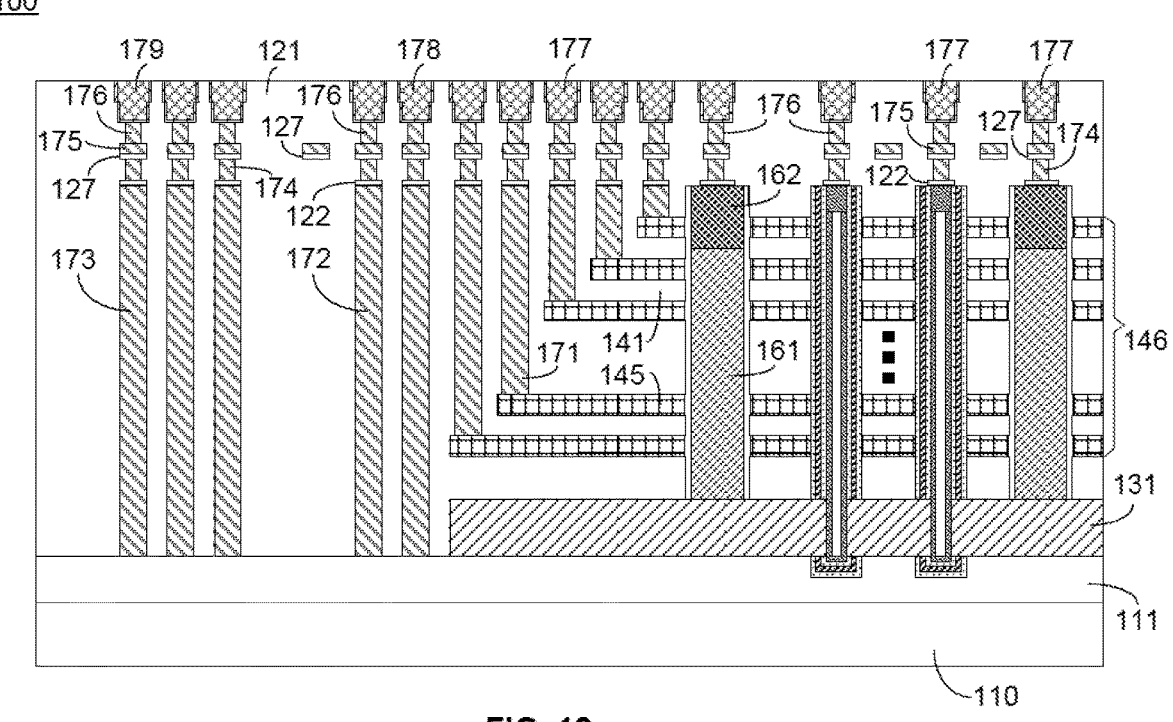
FIG. 19 illustrates a cross-sectional views of the 3D array device shown in FIG. 18 at a certain stage in the fabrication process according to various aspects of the present disclosure.

Further, a CVD or PVD process is performed to deposit a dielectric material (e.g., silicon oxide or silicon nitride) to cover the vias 176 and thicken the dielectric layer 121 further. Openings are made and then filled to form connecting pads 177, 178, and 179 that serve as interconnects with a periphery device. As shown in FIG. 19, the connecting pads 177-179 are deposited over and contact the vias 176, respectively. As such, the connecting pads 177 are connected to the word line contacts 171, the upper ends of corresponding NAND strings, and the plugs 162, respectively. The connecting pads 178 and 179 are connected to the through silicon contacts 172 and 173, respectively. The connecting pads 177-179 may include a conductive material such as W, Co, Cu, Al, or a combination thereof. Optionally, a contact layer of a conductive material (e.g., TiN) may be deposited first before filling the openings to form the connecting pads 177-179. The 3D array device as shown in FIG. 19 may be referred to as 3D array device 100.

Figure 20:
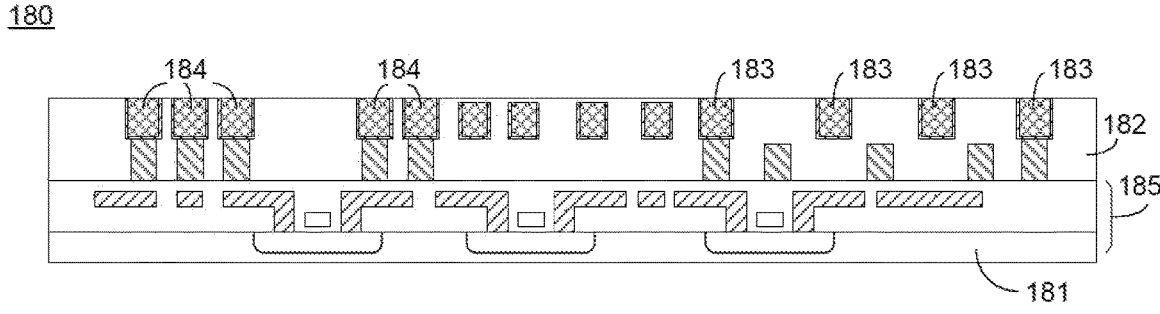
FIG. 20 illustrates a cross-sectional view of an exemplary periphery device according to various aspects of the present disclosure.

FIG. 20 shows a schematic cross-sectional view of a periphery device 180 according to aspects of the present disclosure. The periphery device 180 is a part of a 3D memory device and may also be referred to as a peripheral structure. The periphery device 180 includes a substrate 181 that may include single crystalline silicon, Ge, SiGe, SiC, SOI, GOI, polysilicon, or a Group III-V compound such as GaAs or InP. Periphery CMOS circuits 185 (e.g., control circuits) are fabricated on the substrate 181 and used for facilitating the operation of the 3D memory device. For example, the periphery CMOS circuits 185 may include metal-oxide-semiconductor field-effect transistors (MOS-FETs) and provide functional devices such as page buffers, sense amplifiers, column decoders, and row decoders. A dielectric layer 182 is deposited over the substrate 181 and the CMOS circuits 185. Connecting pads (such as connecting pads 183 and 184) and vias for interconnect are formed in the dielectric layer 182. The dielectric layer 182 includes one or more dielectric materials such as silicon oxide and silicon nitride. The connecting pads 183-184 are formed to connect with the 3D array device 100 and may include a conductive material such as W, Co, Cu, Al, Ti or a combination thereof.

For the 3D array device 100 and periphery device 180, the bottom side of the substrate 110 or 181 may be referred to as the back side, and the side with the connecting pads 177-179 or 183-184 may be referred to as the front side or face side.

Figure 21:
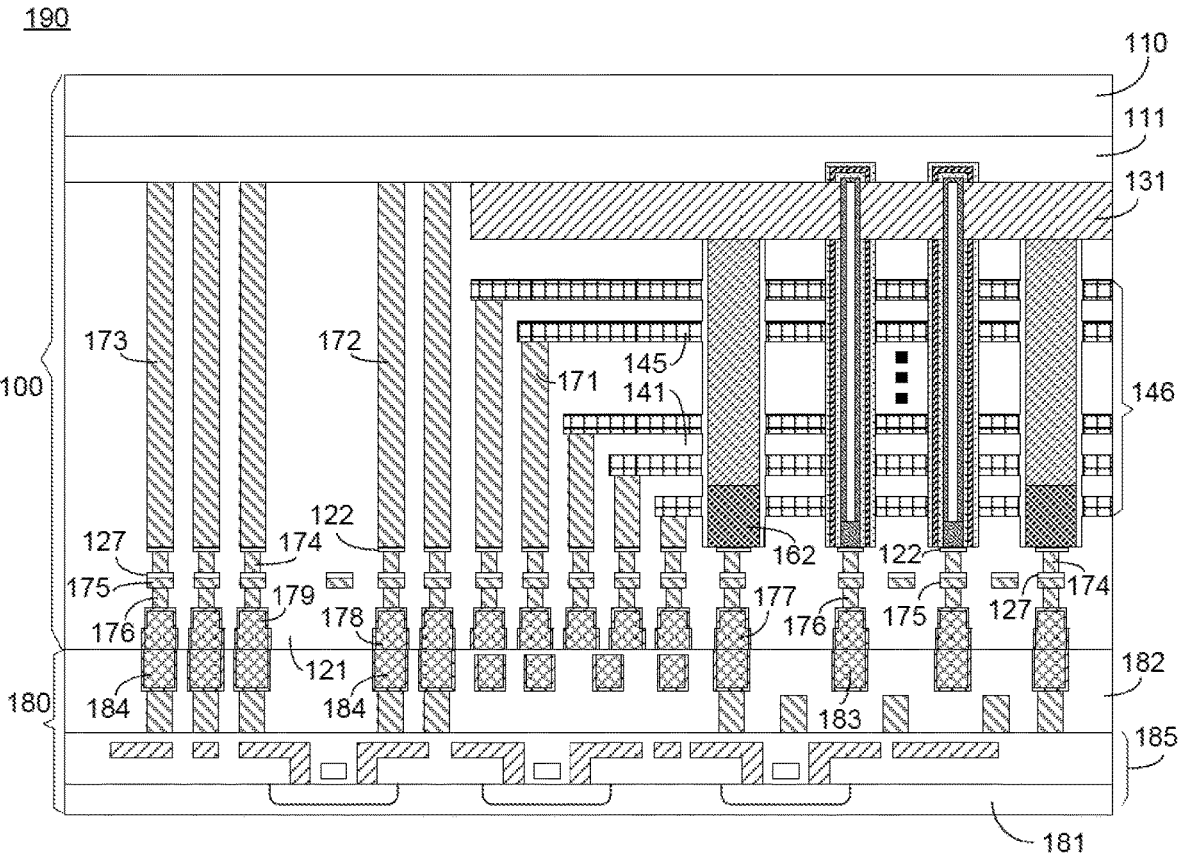
FIG. 21 illustrates a cross-sectional view of a 3D memory device after the 3D array device shown in FIG. 19 is bonded with the periphery device shown in FIG. 20 according to various aspects of the present disclosure.

FIG. 21 schematically shows a fabrication process of an exemplary 3D memory device 190 in a cross-sectional view according to aspects of the present disclosure. The 3D memory device 190 includes the 3D array device 100 shown in FIG. 19 and the periphery device 180 shown in FIG. 20. In some embodiments, the 3D array device 100 and the periphery device 180 are fabricated separately and then bonded together to form the 3D memory device 190. Alternatively, the periphery device 180 may be made first, and the 3D array device 100 may be built using the device 180 as a substrate component, forming an integrated 3D memory device.

Provided the 3D array device 100 and periphery device 180 are bonded by a flip-chip bonding method to form the 3D memory device 190, as shown in FIG. 21. In some aspects, the 3D array device 100 is flipped vertically and becomes upside down with the top surfaces of the connecting pads 177-179 facing downward. The two devices are placed together such that the 3D array device 100 is above the periphery device 180. After an alignment is made, e.g., the connecting pads 177-179 are aligned with the connecting pads 183-184, respectively, the 3D array device 100 and periphery device 180 are joined face to face and bonded together. The conductor/insulator stack 146 and the periphery CMOS circuits become sandwiched between the substrates 110 and 181 or between the doped region 111 and the substrate 181. In some aspects, a solder or a conductive adhesive is used to bond the connecting pads 177-179 with the connecting pads 183-184, respectively. As such, the connecting pads 177-179 are connected to the connecting pads 183-184, respectively. The 3D array device 100 and periphery device 180 are in electrical communication after the flip-chip bonding process is completed.

Thereafter, other fabrication steps or processes are performed to complete fabrication of the 3D memory device 190. The other fabrication steps and processes are not reflected in FIG. 21 for simplicity. For example, from the bottom surface (after the flip-chip bonding), the substrate 110 of the 3D array device 100 is thinned by a thinning process, such as wafer grinding, dry etch, wet etch, CMP, or a combination thereof. A dielectric layer is grown over the doped region 111 by a deposition process (e.g., a CVD or PVD process). With similar methods as described above, vias and conductor layers are formed that connect some of the through silicon contacts 172 and 173, respectively. Further, a passivation layer is deposited and contact pads are formed. The contact pads may be connected to certain contacts 172 and/or 173. Further, additional fabrication steps or processes are performed. Details of the additional fabrication steps or processes are omitted for simplicity.

The 3D memory device 190 is based on the structure of the 3D array device 100 shown in FIG. 7A. In some other cases, another 3D memory device may be fabricated based on the structure of the 3D array device 100A shown in FIG. 7B. In these cases, after a flip-chip bonding step, the substrate 110 of the 3D array device 100A may be removed from the bottom by a thinning process, such as wafer grinding, dry etch, wet etch, CMP, or a combination thereof. Provided the layers 132-135 are polysilicon, silicon oxide, silicon nitride, and polysilicon, respectively. The layer 132 is exposed and etched. After the layer 132 is removed, the layer 133 and blocking layer 152 become exposed. Then, layers 133-134 and 152-154 are etched out by certain selective etches. The layer 135 and semiconductor channel 155 are exposed. A conductive material or semiconductor material (e.g., doped polysilicon) may be deposited to form a layer that connects with semiconductor channels 155 and functions as an array common source.

Figure 22:
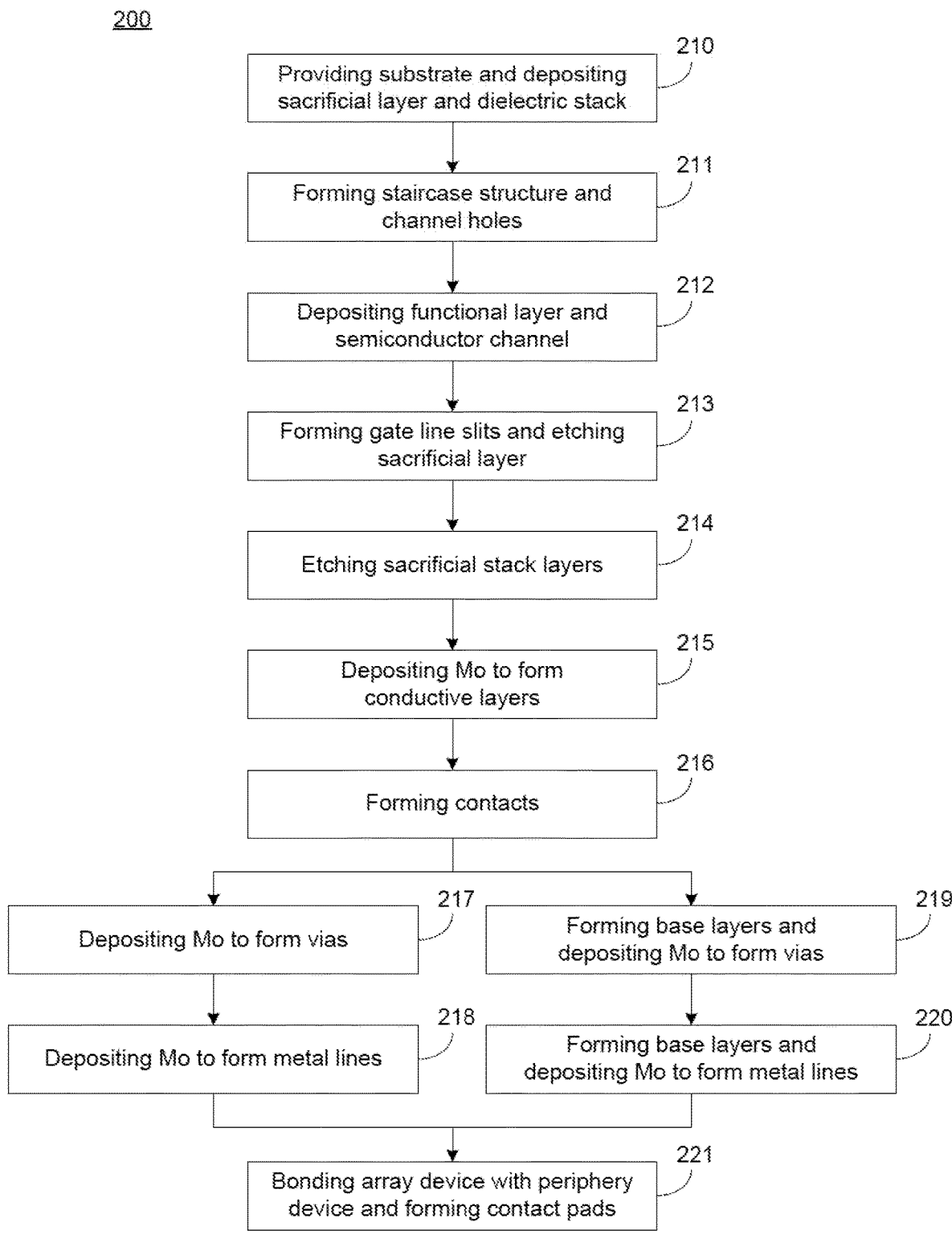
FIG. 22 illustrates a schematic flow chart of fabrication of a 3D memory device according to various aspects of the present disclosure.

FIG. 22 shows a schematic flow chart 200 for fabricating a 3D memory device according to aspects of the present disclosure. At 210, a substrate is provided for fabricating a 3D array device. A sacrificial layer is deposited over a top surface of the substrate for the 3D array device. The substrate includes a semiconductor substrate, such as a single crystalline silicon substrate. In some aspects, a cover layer is grown on the substrate before depositing the sacrificial layer. The cover layer includes a single layer or multiple layers that are grown sequentially over the substrate. For example, the cover layer may include silicon oxide, silicon nitride, and/or aluminum oxide. In some other aspects, the sacrificial layer may be deposited without first depositing the cover layer over the substrate. The sacrificial layer may include single crystalline silicon, polysilicon, silicon oxide, or silicon nitride.

Over the sacrificial layer, a dielectric stack of the 3D array device is fabricated. The dielectric stack includes a first stack layer and a second stack layer that are alternately stacked. The first stack layer includes a first dielectric layer and the second stack layer includes a second dielectric layer that is different than the first dielectric layer. In some aspects, one of the first and second dielectric layers is used as a sacrificial stack layer.

With certain alternative methods, a multi-layer including, e.g., a silicon oxide layer, silicon nitride layer, and polysilicon layer may be deposited between the sacrificial layer and dielectric stack. The polysilicon layer may be the top of the multi-layer.

At 211, a staircase formation process is performed to convert a portion of the dielectric stack into a staircase structure in some aspects. The staircase formation process includes multiple etches that are used to trim the portion of the dielectric stack into the staircase structure. A deposition process is performed to deposit a dielectric layer to cover the staircase structure. A part of the dielectric layer on a side of the staircase structure is used as a contact region where through silicon contacts for contact pads are configured. Further, channel holes are formed that extend through the dielectric stack and the sacrificial layer to expose portions of the substrate.

At 212, a functional layer is deposited on the sidewall and bottom surface of each channel hole. The functional layer includes a blocking layer, a charge trap layer, and a tunneling layer that are formed sequentially. Thereafter, a semiconductor channel is deposited on a surface of the tunneling layer.

At 213, gate line slits of the 3D array device are formed. Along a direction vertical to the substrate, the gate line slits extend through the dielectric stack. After the gate line slits are etched, portions of the sacrificial layer are exposed. In some embodiments, the sacrificial layer is etched away and a cavity is created above the substrate. The cavity exposes a bottom portion of the functional layer in the cavity. The cover layer is also exposed in the cavity, if it is deposited on the substrate. The layers of the functional layer exposed sequentially in the cavity, including the blocking layer, the charge trap layer, and the tunneling layer, are etched away, respectively. That is, the bottom portion of the functional layer that is close to the substrate is removed. The cover layer, if deposited, is also etched away during the process to etch the bottom portion of the functional layer or in another selective etch process. Hence, a portion of the substrate and portions of the semiconductor channel are exposed in the cavity.

Thereafter, a deposition process is performed to grow a semiconductor layer such as a polysilicon layer in the cavity. The semiconductor layer contacts the semiconductor channel and the substrate.

In some aspects, the dielectric stack includes two dielectric stack layers and one of the dielectric stack layers is sacrificial. The sacrificial stack layers are etched away at 214 to leave cavities in the dielectric stack.

In the alternative methods, the gate line slit is formed to expose the polysilicon layer of the multi-layer at the bottom and the sacrificial stack layers on the sidewall. The sacrificial stack layers are then etched away to form cavities in the dielectric stack.

At 215, the cavities are filled with conductive materials to form conductive layers. The dielectric stack is transformed into a conductor/insulator stack. In some aspects, the Mo filling process is implemented to deposit metal Mo that forms the conductive layers. For example, Mo is deposited to form a Mo layer by CVD and/or ALD. Cavities left by removing the sacrificial stack layers are partially filled by the Mo layer at a deposition step. Then, the Mo layer is partially removed to enlarge the entrance of the cavities at an etch step, followed by Mo deposition to grow the Mo layer in the cavities at another deposition step. The deposition-etch-deposition cycle is performed multiple times to fill the cavities completely. The filled cavities become the conductive layers that have fewer hollow seams and voids or in some cases, no seams and voids.

Further, a dielectric layer is deposited on the side wall and bottom surface of the gate line slits. Optionally, portions of the dielectric layer on the bottom surfaces are etched out selectively to expose the semiconductor layer. Conductive materials, such as TiN, W, Cu, Al, and/or doped polysilicon are deposited in the gate line slits to form an array common source that contacts the semiconductor layer. In the alternative methods, the gate line slits may be filled with dielectric materials.

At 216, etching and deposition processes are performed to form word line contacts and through silicon contacts. The contacts may be made of a conductive material such as W, Mo, Ru, Co, Cu, Al. In some embodiments, Mo may be deposited to form the contacts by the Mo filling process.

At 217 and 218, vias and conductor layers such as metal lines are formed for interconnect. The vias and metal lines may contain a conductive material such as W, Mo, Ru, Co, Cu, Al. In some embodiments, the Mo filling process is implemented to deposit Mo to form the vias and metal lines that have fewer hollow seams and voids or in some cases, no seams and voids.

Optionally, at 219 and 220, vias and metal lines may be fabricated by the Mo deposition process, respectively. For example, base layers containing TiN, Mo, or Ru may be deposited before depositing Mo to form the vias or metal lines. Again, the vias and metal lines have fewer hollow seams and voids or in some cases, no seams and voids.

At 221, a 3D memory device is fabricated. In some aspects, a flip-chip bonding process is performed to bond the 3D array device and a periphery device or fasten the 3D array device with a periphery device to create the 3D memory device. In some other cases, a periphery device is made first. Thereafter, the 3D array device is formed over the periphery device, creating an integrated 3D memory device. Referring to the former scenario, the 3D array device is flipped upside down and positioned above the periphery device. The connecting pads of the 3D array device and the periphery device are aligned and then bonded. After the substrate of the 3D array device is thinned, etching and deposition processes are performed to form vias, conductor layers, and contact pads over the through silicon contacts in the contact region of the 3D array device. The contact pads are configured for wire bonding for connection with other devices.

Because certain contacts, vias, conductive layers, and metal lines may have fewer hollow seams and voids or no seams and voids, electrical resistance may be decreased and the performance of 3D NAND memory device may be enhanced. Further, reliability issues with the seams and voids may be improved. Since the above-described methods and processes are about semiconductor manufacturing, these methods and processes apply to fabrication of a wide range of semiconductor structures and devices.

Figure 23:
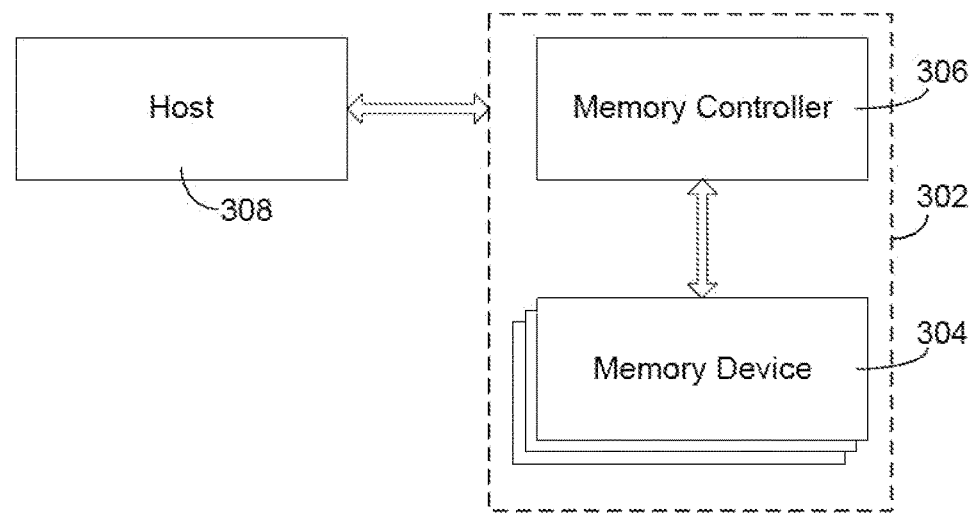
FIG. 23 illustrates a block diagram of an exemplary system having memory devices according to various embodiments of the present disclosure.

FIG. 23 shows a block diagram of an exemplary system 300 having a memory device according to various aspects of the present disclosure. The system 300 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 23, the system 300 may include a host 308 and a memory system 302 having one or more memory devices 304 and a memory controller 306. The host 308 may be a processor of an electronic device, such as a central processing unit (CPU), or a system-on-chip (SoC), such as an application processor (AP). The host 308 may be configured to send or receive data to or from the memory devices 304.

The memory controller 306 is coupled to the memory devices 304 and host 308 and is configured to control the memory devices 304, according to some implementations. The memory controller 306 may manage the data stored in the memory devices 304 and communicate with the host 308. In some embodiments, the memory controller 306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some other embodiments, the memory controller 306 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 306 may be configured to control operations of the memory device 304, such as read, erase, and program operations.

The memory controller 306 may also be configured to manage various functions with respect to the data stored or to be stored in the memory device 304 including, but not limited to bad-block management, garbage collection, logical-to-physical address conversion, wear leveling, etc. In some implementations, the memory controller 306 is further configured to process error correction codes (ECCs) with respect to the data read from or written to the memory device 304. Any other suitable functions may be performed by the memory controller 306 as well, for example, formatting the memory device 304. The memory controller 306 may communicate with an external device (e.g., the host 308) according to a particular communication protocol. For example, the memory controller 306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The memory device 304 may be any memory device disclosed in the present disclosure, such as the 3D memory device 190 shown in FIG. 21. As the 3D memory device 190 may have improved performance and reliability due to the reasons described above, when the device 190 is used, the system 300 may have improved performance and reliability, as well.

Figure 24:
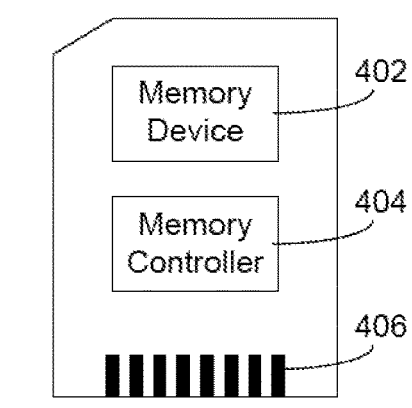
FIG. 24 illustrates a diagram of an exemplary memory card having a memory device according to various aspects of the present disclosure.
Figure 25:
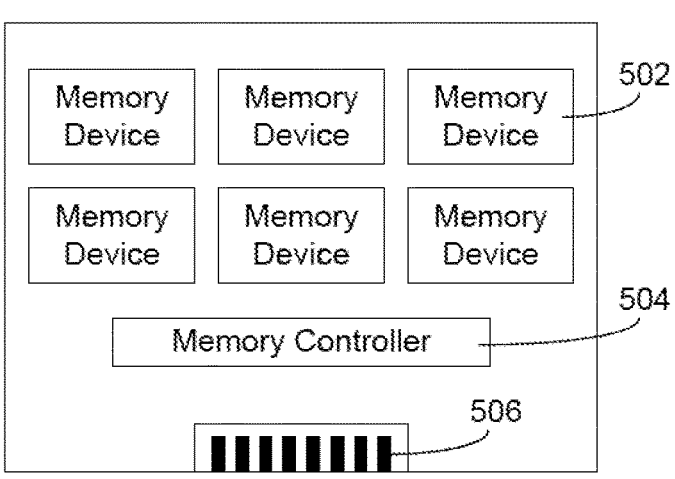
FIG. 25 illustrates a diagram of an exemplary solid-state drive (SSD) having memory devices according to various aspects of the present disclosure.

The memory controller 306 and one or more memory devices 304 may be integrated into various types of storage devices, for example, be included in the same package, such as a universal Flash storage (UFS) package or an eMMC package. That is, the memory system 302 may be implemented and packaged into different types of end electronic products. FIGS. 24 and 25 exemplarily illustrate block diagrams of a memory card 400 and an SSD 500 according to various aspects of the present disclosure. As shown in FIG. 24, a memory controller 404 and a single memory device 402 may be integrated into the memory card 400. The memory device 402 may be any memory device illustrated above, such as the 3D memory device 190 shown in FIG. 21. The memory card 400 may include a PC card (personal computer memory card international association (PCM-CIA)), a CF card, a smart media (SM) card, a memory stick, a multimedia card (MMC, RS-MMC, or MMCmicro), an SD card (SD, miniSD, microSD, or SDHC), a UFS, etc. The memory card 400 may further include a memory card connector 406 configured to couple the memory card 400 to a host (e.g., the host 308 shown in FIG. 23). As shown in FIG. 25, a memory controller 504 and multiple memory devices 502 may be integrated into the SSD 500. The memory devices 502 may be any aforementioned memory device, such as the 3D memory device 190 shown in FIG. 21. The SSD 500 may further include an SSD connector 506 configured to couple the SSD 500 to a host (e.g., the host 308 shown in FIG. 23). In some embodiments, the storage capacity and/or the operation speed of the SSD 500 is greater than those of the memory card 400.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A structure, comprising:
a dielectric region;
a conductive member in the dielectric region and extending along a vertical direction;
a base layer formed directly on an entire top surface of the conductive member and in the dielectric region, the base layer including a first material different than a dielectric material of the dielectric region; and
a conductive element deposited directly on the first material of the base layer and directly on sidewalls of the dielectric region, wherein
the conductive element includes a lateral dimension smaller than a lateral dimension of the base layer, and
the conductive element includes a conductive molybdenum (Mo) material having a higher deposition rate directly on the first material that includes titanium nitride (TiN), Mo, or ruthenium (Ru) than on the dielectric material of the dielectric region to provide the conductive element with reduced seams or voids there-in.

2. The structure according to claim 1, wherein the dielectric region includes an oxide or nitride material.

3. The structure according to claim 1, wherein the conductive element includes a via or a conductive line.

4. The structure according to claim 1, wherein the conductive member includes at least one of a word line contact, a through contact, an interconnect, a via contact, or a plug.

5. The structure according to claim 1, wherein the conductive Mo material is arranged for formation of the conductive element in a bottom-up manner to reduce seams or voids.

6. A system, comprising:

a memory device; and a memory controller for controlling the memory device, the memory device comprising a structure, the structure comprising:

a dielectric region;

a conductive member in the dielectric region and extending along a vertical direction;

a base layer formed directly on an entire top surface of the conductive member and in the dielectric region, the base layer including a first material different than a dielectric material of the dielectric region; and a conductive element deposited directly on the first material of the base layer and directly on sidewalls of the dielectric region, wherein the conductive element includes a lateral dimension smaller than a lateral dimension of the base layer, and the conductive element includes a conductive molybdenum (Mo) material molybdenum (Mo) having a higher deposition rate directly on the first material that includes titanium nitride (TiN), Mo, or ruthenium (Ru) than on the dielectric material of the dielectric region to provide the conductive element with reduced seams or voids there-in.

7. The system according to claim 6, wherein the dielectric region includes an oxide or nitride material.

8. The system according to claim 6, wherein the conductive element includes a via or a conductive line.

9. The system according to claim 6, wherein the conductive member includes at least one of a word line contact, a through contact, an interconnect, a via contact, or a plug.

10. The system according to claim 6, wherein the conductive Mo material is arranged for formation of the conductive element in a bottom-up manner to reduce seams or voids.

11. A method for fabricating a structure, comprising:

forming a conductive member in a dielectric layer;

depositing a first material to form a base layer directly on an entire top surface of the conductive member, the first material including titanium nitride (TiN), molybdenum (Mo), or ruthenium (Ru);

depositing a dielectric material to grow the dielectric layer to cover the base layer;

forming an opening through the dielectric layer to expose the base layer at a bottom of the opening; and depositing a conductive Mo material to fill the opening, a deposition rate of the conductive Mo material over a surface of the base layer being higher than a deposition rate of the conductive Mo material over a surface of a sidewall of the opening in the dielectric layer, the conductive Mo material arranged for filling the opening with reduced seams or voids.

12. The method according to claim 11, wherein the dielectric material includes an oxide material or a nitride material.

13. The method according to claim 11, wherein depositing the conductive Mo material to fill the opening comprises:

using molybdenum pentachloride ($MoCl_5$) and hydrogen; and performing chemical vapor deposition (CVD) and/or atomic layer deposition (ALD) to deposit the conductive material Mo to fill the opening.

14. The method according to claim 11, wherein depositing the conductive Mo material to fill the opening comprises:

performing chemical vapor deposition (CVD) and/or atomic layer deposition (ALD) to deposit the conductive Mo material to fill the opening in the bottom-up manner.

15. The method according to claim 11, wherein depositing the conductive Mo material to fill the opening includes:

depositing the conductive Mo material to form a conductive layer inside the opening at a first deposition step;

after the first deposition step, removing a portion of the conductive layer to avoid closure of the opening at a first etch step; and after the first etch step, depositing the conductive Mo material inside the opening to grow the conductive layer to fill the opening at a second deposition step.

16. The method according to claim 15, wherein depositing the conductive Mo material to fill the opening further includes:

performing a second etch step to remove a part of the conductive layer to avoid closure of the opening after the second deposition step; and performing a third deposition step to deposit the conductive Mo material inside the opening to grow the conductive layer to fill the opening after the second etch step.

17. The method according to claim 11, wherein the conductive Mo material is deposited inside the opening to form a via or a conductive line.

18. The method according to claim 15, wherein removing the portion of the conductive layer to avoid closure of the opening at the first etch step comprises:

using molybdenum pentachloride ($MoCl_5$); and performing chemical vapor deposition (CVD) and/or atomic layer deposition (ALD) to remove the portion of the conductive layer.

19. The method according to claim 15, wherein removing the portion of the conductive layer to avoid closure of the opening at the first etch step comprises:

removing the conductive Mo material from the conductive layer, wherein a desorption rate of the conductive Mo material is higher in an area close to an entrance of the opening than a desorption rate of the conductive Mo material in an area at the bottom of the opening.

* * * * *